US012763514B2

(12) United States Patent
Van Der Kroon et al.

(10) Patent No.: US 12,763,514 B2
(45) Date of Patent: Oct. 13, 2026

(54) HIGH VOLTAGE FEEDTHROUGH AND CONNECTOR FOR A CHARGED PARTICLE APPARATUS

(71) Applicant: ASML Netherlands B.V., Veldhoven (NL)

(72) Inventors: Boudewijn Weijert Herman Jan Van Der Kroon, Amstelveen (NL); Jurgen Van Soest, Hegelsom (NL)

(73) Assignee: ASML Netherlands B.V., Veldhoven (NL)

(*) Notice: Subject to any disclaimer, the term of this patent is extended or adjusted under 35 U.S.C. 154(b) by 670 days.

(21) Appl. No.: 18/122,601

(22) Filed: Mar. 16, 2023

(65) Prior Publication Data

US 2023/0238736 A1 Jul. 27, 2023

Related U.S. Application Data

(63) Continuation of application No. PCT/EP2021/073051, filed on Aug. 19, 2021.

(30) Foreign Application Priority Data

Sep. 16, 2020 (EP) .................................... 20196493

(51) Int. Cl.

*H01R 13/52* (2006.01)
*H01J 37/18* (2006.01)
*H01J 37/248* (2006.01)

(52) U.S. Cl.

CPC .......... *H01R 13/5221* (2013.01); *H01J 37/18* (2013.01); *H01J 37/248* (2013.01)

(58) Field of Classification Search

CPC ............................... H01R 13/53; H01J 37/248
See application file for complete search history.

(56) References Cited

U.S. PATENT DOCUMENTS 3,747,048 A 7/1973 Johnson et al.
3,824,526 A 7/1974 Glover
(Continued)

FOREIGN PATENT DOCUMENTS

CN 102405560 A 4/2012
CN 205092369 U 3/2016
(Continued)

OTHER PUBLICATIONS

International Search Report issued in related Foreign Application No. PCT/EP2021/073051; mailed Jun. 7, 2022 (6 pgs.).

*Primary Examiner* — Abdullah A Riyami
(74) *Attorney, Agent, or Firm* — FINNEGAN, HENDERSON, FARABOW, GARRETT & DUNNER, LLP

(57) ABSTRACT

Disclosed herein is a connector for electrically connecting a feedthrough of a vacuum tool to a high voltage power source, the connector comprising: a connector wire assembly configured to be in electrical connection with a high voltage power source; and a connector insulator comprising a channel configured to extend into the connector insulator and to receive a feedthrough pin so as to electrically connect the connector wire assembly with the feedthrough pin; wherein the connector insulator is configured to engage with the feedthrough so that a boundary surface of the connector insulator extends substantially bi-directionally in the direction of the longitudinal axis of the channel.

20 Claims, 12 Drawing Sheets

(56) References Cited

U.S. PATENT DOCUMENTS

| | | | | |
|---|---|---|---|---|
| 3,842,393 | A * | 10/1974 | Glover .................. | H01R 13/53 439/281 |
| 4,159,860 | A | 7/1979 | Broad | |
| 4,886,471 | A | 12/1989 | Fleshman | |
| 7,147,493 | B1 | 12/2006 | Mahoney | |
| 7,497,723 | B2 | 3/2009 | Brassell et al. | |
| 2019/0081435 | A1 | 3/2019 | Lewin et al. | |

FOREIGN PATENT DOCUMENTS

| | | | |
|---|---|---|---|
| CN | 107732519 | A | 2/2018 |
| CN | 207052806 | U | 2/2018 |
| CN | 207116766 | U | 3/2018 |
| GB | 2119178 | A | 11/1983 |
| JP | H11289651 | A | 10/1999 |
| JP | 2005086971 | A | 3/2005 |
| JP | 2014229418 | A | 12/2014 |
| JP | 2020087580 | A | 6/2020 |
| TW | 200305724 | A | 11/2003 |
| WO | WO 2015/199550 | A2 | 12/2015 |

* cited by examiner

HIGH VOLTAGE FEEDTHROUGH AND CONNECTOR FOR A CHARGED PARTICLE APPARATUS

CROSS-REFERENCE TO RELATED APPLICATIONS

This application claims priority of International application PCT/EP2021/073051, which was filed on 19 Aug. 2021, and claims priority of EP application 20196493.9, which was filed on 16 Sep. 2020. These applications are incorporated herein by reference in their entireties.

FIELD

The embodiments provided herein generally relate to the provision of a high voltage power supply to a vacuum tool, such as a charged particle apparatus. Embodiments provide new designs of high voltage power interface. An advantage of embodiments may include the required area on the outer wall of a vacuum tool to accommodate a feedthrough being smaller than with known high voltage power interfaces.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Dedicated flood columns may be used in conjunction with an SEM to flood a large area of the surface of a substrate or other sample with charged particles in a relatively short time. Flood columns are thus useful tools to pre-charge a wafer surface and set the charging conditions for subsequent inspection with an SEM. A dedicated flood column can enhance the voltage contrast defect signal, thereby increasing the defect detection sensitivity and/or throughput of an SEM. During charged particle flooding, the flood column is used to provide a relatively large amount of charged particles to quickly charge a predefined area. Afterwards, the primary electron source of an e-beam inspection system is applied to scan an area within the pre-charged area to achieve imaging of the area.

There is a general need to improve charged particle apparatuses such as SEMs, flood columns and for lithography.

SUMMARY

Advancements in the specifications of charged particle apparatuses require increasing the number of components in a charged particle apparatus. For example, the number of sources may be increased in order to increase the number of beams in a multi-beam of charged particles that may be provided. The number of lenses, and other charged particle manipulators, may also need to be increased so that the increased number of source beams may be appropriately manipulated. Charged particle apparatuses therefore need to comprise more components and these need to be integrated into the architecture of the charged particle apparatus. In particular, a flood column may need to be integrated with a SEM.

A problem caused by the above-identified advancements is that the available volume within a charged particle apparatus for some, or all, of the components is limited. A component that may be affected by these space restrictions is the power interface of a high voltage power supply to the charged particle apparatus. The high voltage power supply may be required, for example, by a flood column so that it is capable of providing the required current to flood and thereby charge a sample.

Embodiments provide a new design of high voltage power interface for a vacuum tool, such as a charged particle apparatus. The power interface comprises a feedthrough and corresponding connector. The feedthrough may be located in, or on, the outer wall of a charged particle apparatus and is arranged to receive a high voltage connector. The feedthrough and connector are designed so that a distance across boundary surface of each of the feedthrough and connector exceeds a minimum creep length and is bi-directional in directions parallel to an axis of a feedthrough pin. This reduces the required area of the feedthrough in an outer wall of the charged particle apparatus and also the volume required in the charged particle apparatus to accommodate the feedthrough.

According to some embodiments of the present disclosure, there is provided a connector for electrically connecting a feedthrough of a vacuum tool to a high voltage power source, the connector comprising: a connector wire assembly configured to be in electrical connection with a high voltage power source; and a connector insulator comprising a channel configured to extend into the connector insulator and to receive a feedthrough pin so as to electrically connect the connector wire assembly with the feedthrough pin; wherein the connector insulator is configured to engage with the feedthrough so that a boundary surface of the connector insulator extends substantially bi-directionally in the direction of the longitudinal axis of the channel. The wire assembly may comprise a plug for receiving the end of the feedthrough pin. The boundary surface may substantially extend into the connector insulator.

According to some embodiments of the present disclosure, there is provided a feedthrough for providing a high voltage power supply to a device in a vacuum tool, the feedthrough comprising: a feedthrough insulator configured to engage with a connector; and a feedthrough pin that protrudes from a recessed surface of the feedthrough insulator; wherein the feedthrough pin is configured to electrically connect to a connector wire assembly of the connector; and the feedthrough insulator comprises a boundary surface that extends substantially bi-directionally in the direction of the longitudinal axis of the feedthrough pin. The feedthrough pin may protrude from a recessed surface of the feedthrough insulator so that an end of the feedthrough pin protrudes from the feedthrough insulator.

According to some embodiments of the present disclosure, there is provided a power interface for a vacuum tool comprising one or more high voltage devices, the electrical connection comprising: a connector according to the first aspect; and a feedthrough according to the second aspect; wherein the connector is engaged with the feedthrough.

According to a fourth aspect of the invention, there is provided a vacuum tool comprising a power interface according to the third aspect.

According to some embodiments of the present disclosure, there is provided a multi-pin connector for electrically connecting a feedthrough of a vacuum tool to a high voltage power source, the connector comprising: at least two connector wire assemblies configured to connect to the high voltage power source; a connector insulator comprising a respective channel for each connector wire assembly, wherein each channel is configured to extend into the connector insulator and to receive an end of a feedthrough pin so as to electrically connect a connector wire assembly with the feedthrough pin; and the connector insulator is configured to engage with the feedthrough so that boundary surfaces of the connector insulator extend substantially bi-directionally in direction of the longitudinal axis of one of the channels.

According to some embodiments of the present disclosure, there is provided a multi-pin feedthrough for providing a high voltage power supply to a device in a vacuum tool, the feedthrough comprising: a feedthrough insulator configured to engage with a connector; and at least two feedthrough pins that each protrude from respective at least two recessed surfaces in the feedthrough insulator; wherein each feedthrough pin is configured to electrically connect to a connector wire assembly of the connector; and the feedthrough insulator comprises boundary surfaces that extend substantially bi-directionally in the direction of the longitudinal axis of the feedthrough pin.

According to some embodiments of the present disclosure, there is provided a high-voltage connector for connecting a feedthrough of a vacuum apparatus to a high voltage power source, the high voltage connector comprising: a connector pin configured to connect electrically with a feedthrough pin of the feedthrough; a connector body of insulating material configured to be insertably engageable with a feedthrough to connect electrically the connector pin and the feedthrough pin; wherein: the connector body provides a bi-directional boundary surface that extends in the direction of the connector pin.

According to some embodiments of the present disclosure, there is provided a high-voltage connector for connecting a feedthrough of a vacuum apparatus to a high voltage power source, the high voltage connector comprising: two connector pins configured to be connected to a high voltage power source, the pins configured to connect electrically with corresponding feedthrough pins of the feedthrough; a connector solid body of insulating material, configured to be insertably engageable with a feedthrough to connect electrically between the connector pins and the corresponding feedthrough pins; wherein the connector body between the connector pins provides a boundary surface that extends bi-directionally in the direction of the connector pins.

According to some embodiments of the present disclosure, there is provided a feedthrough for providing a high voltage to an electrical device within a vacuum apparatus, the feedthrough configured to connect to a high-voltage connector, the feedthrough comprising: a feedthrough pin configured to connect electrically with a connector pin of the feedthrough; a feedthrough body of insulating material configured to be insertably engageable with a connector to connect electrically the connector pin and the feedthrough pin; wherein the feedthrough body provides a bi-directional boundary surface that extends in the direction of the feedthrough pin.

According to some embodiments of the present disclosure, there is provided a feedthrough for providing a high voltage to an electrical device within a vacuum apparatus, the feedthrough configured to connect to a high-voltage connector, the feedthrough comprising: two feedthrough pins configured to connect electrically with corresponding connector pins of the connector; a feedthrough body of insulating material configured to be insertably engageable with a connector to connect electrically between the feedthrough pins and the corresponding connector pins; wherein the feedthrough body between the feedthrough pins provides a boundary surface that extends bi-directionally in the direction of the feedthrough pins.

According to some embodiments of the present disclosure, there is provided an electrical connection for a vacuum tool comprising a high voltage device, the electrical connection comprising the high-voltage connector described above, and the feedthrough providing the high voltage as described above, wherein the feedthrough and connector are engaged so as to be connected.

Other advantages will become apparent from the following description taken in conjunction with the accompanying drawings wherein are set forth, by way of illustration and example, certain example embodiments of the present invention.

BRIEF DESCRIPTION OF FIGURES

The above and other aspects of the present disclosure will become more apparent from the description of exemplary embodiments, taken in conjunction with the accompanying drawings.

Figure 1:
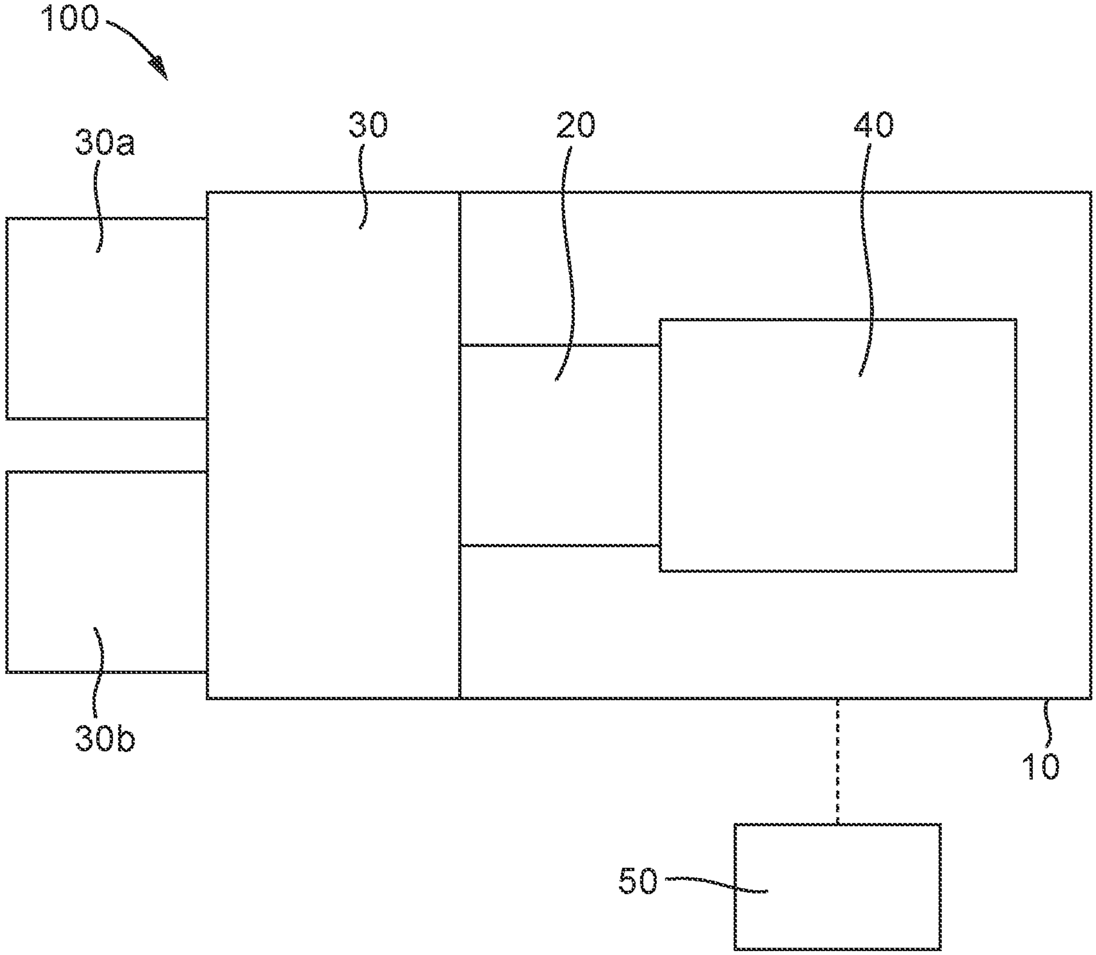
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

DETAILED DESCRIPTION

The embodiments described throughout the present document generally apply to vacuum tools. A preferred application of embodiments is the provision of a power interface to a charged particle apparatus. Although the techniques of embodiments are generally described for a charged particle apparatus, embodiments may be applied to any type of vacuum tool.

The reduction of the physical size of devices, and enhancement of the computing power of electronic devices may be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" may cause device failure. The goal of the manufacturing process is to improve the overall yield of the process. For example, to obtain a 75% yield for a 50-step process (where a step may indicate the number of layers formed on a wafer), each individual step must have a yield greater than 99.4%. If an individual step has a yield of 95%, the overall process yield would be as low as 7-8%.

While high process yield is desirable in an IC chip manufacturing facility, maintaining a high substrate (i.e. wafer) throughput, defined as the number of substrates processed per hour, is also essential. High process yield and high substrate throughput may be impacted by the presence of a defect. This is especially if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate interaction products, such as secondary electrons and/or backscattered electrons. The detection apparatus captures the secondary electrons and/or backscattered electrons from the sample as the sample is scanned so that the SEM may create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam may scan different parts of a sample simultaneously. A multi-beam inspection apparatus may therefore inspect a sample at a much higher speed than a single-beam inspection apparatus.

In a multi-beam inspection apparatus, the paths of some of the primary electron beams are displaced away from the central axis, i.e. a mid-point of the primary electron-optical axis (also referred to herein as the charged particle axis), of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations that cause the resulting image to be blurry and out-of-focus. An example is spherical aberrations which bring the focus of each sub-beam path into a different focal plane. In particular, for sub-beam paths that are not on the central axis, the change in focal plane in the sub-beams is greater with the radial displacement from the central axis. Such aberrations and de-focus effects may remain associated with the secondary electrons from the target when they are detected, for example the shape and size of the spot formed by the sub-beam on the target will be affected. Such aberrations therefore degrade the quality of resulting images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas molecules in main chamber 10 so that the pressure around the sample reaches a second pressure lower than the first pressure. After reaching the second pressure, the sample is transported to the electron beam tool by which it may be subject to charged particle flooding and/or inspection. An electron beam tool 40 may comprise either a single beam or a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it may be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
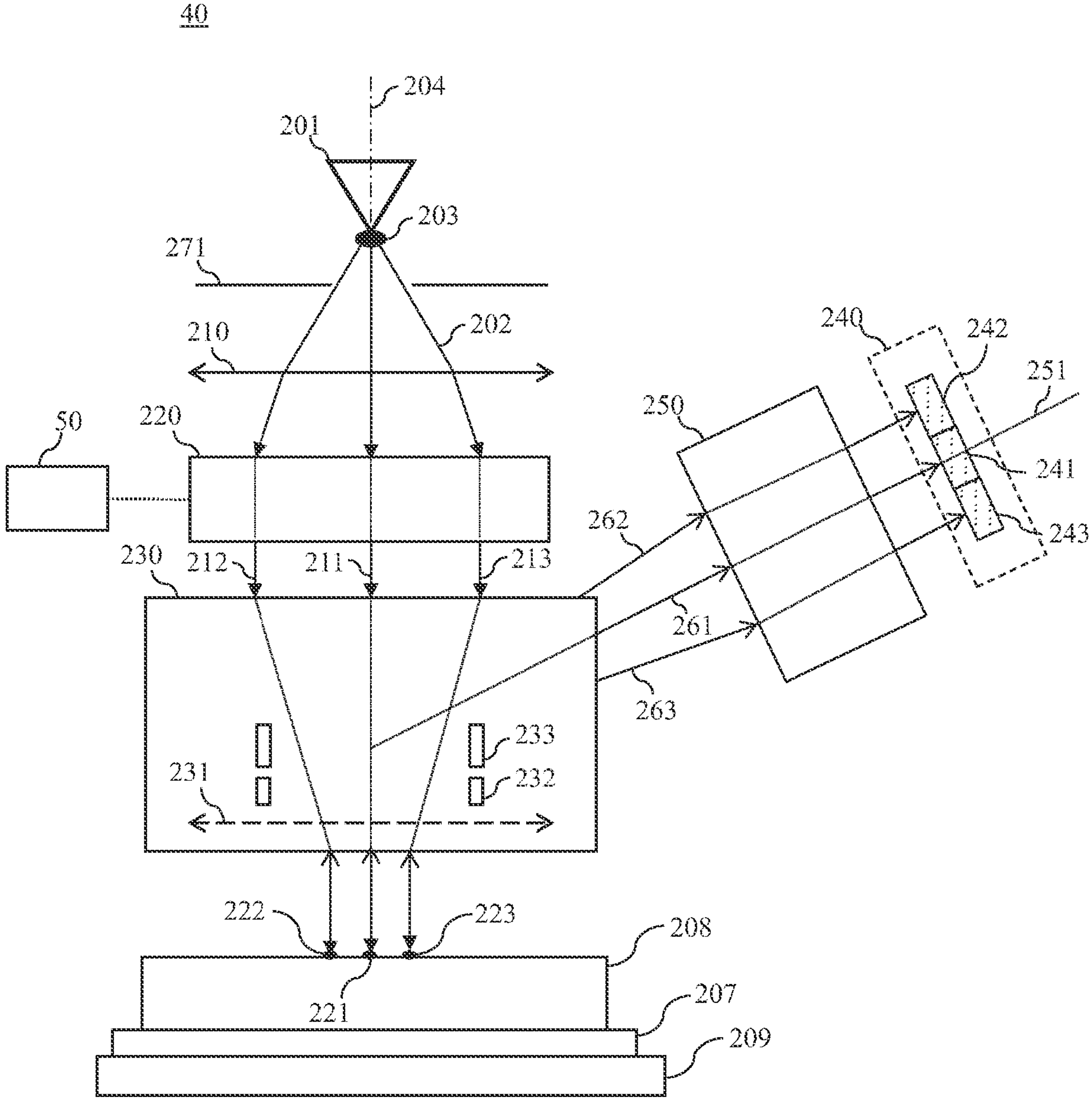
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection or for charged particle flooding. Multi-beam electron beam tool 40 may further comprise a secondary projection apparatus 250 and an associated electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components may include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

The formed primary electron beam 202 may be a single beam and a multi-beam may be generated from the single beam. At different locations along the beam path, the primary electron beam 202 may therefore be either a single beam or a multi-beam. By the time it reaches the sample, and preferably before it reaches the projection apparatus, the primary electron beam 202 is a multi-beam. Such a multi-beam may be generated from the primary electron beam in a number of different ways. For example, the multi-beam may be generated by a multi-beam array located before the cross-over 203, a multi-beam array located in the source conversion unit 220, or a multi-beam array located at any point in between these locations. A multi-beam array may comprise a plurality of electron beam manipulating elements arranged in an array across the beam path. Each manipulating element may influence at least part of the primary electron beam to generate a sub-beam. Thus the multi-beam array interacts with an incident primary beam path to generate a multi-beam path down-beam of the multi-beam array. The interaction of the multi-beam array with the primary beam may include one or more aperture arrays, individual deflectors e.g. per sub-beam, lenses, stigmators and (aberration) correctors, again e.g. per sub-beam.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also include multiple openings for generating primary sub-beams (not shown) even before the source conversion unit 220 and may be referred to as a coulomb aperture array.

Condenser lens 210 is configured to focus (or collimate) primary electron beam 202. In some embodiments, the condenser lens 210 may be designed to focus (or collimate) primary electron beam 202 to become a substantially parallel beam and be substantially normally incident onto source conversion unit 220. Condenser lens 210 may be a movable condenser lens that may be configured so that the position of its principle plane is movable. In some embodiments, the movable condenser lens may be configured to physically move, e.g. along the optical axis 204. Alternatively, the movable condenser lens may be constituted of two or more electro-optical elements (lenses) in which the principle plane of the condenser lens moves with a variation of the strength of the individual electro-optical elements. The (movable) condenser lens may be configured to be magnetic, electrostatic or a combination of magnetic and electrostatic lenses. In a further example, the condenser lens 210 may be an anti-rotation condenser lens. The anti-rotation condenser lens may be configured to keep the rotation angles unchanged when the focusing power (collimating power) of condenser lens 210 is changed and/or when the principle plane of the condenser lens moves.

In an example of the source conversion unit 220, the source conversion unit 220 may comprise an image-forming element array, an aberration compensator array, a beam-limit aperture array, and a pre-bending micro-deflector array. The pre-bending micro-deflector array may, for example, be optional and may be present in an example in which the condenser lens does not ensure substantially normal incidence of sub-beams originating from the coulomb aperture array onto e.g. the beam-limit aperture array, the image-forming element array, and/or the aberration compensator array. The image-forming element array may be configured to generate the plurality of sub-beams in the multi-beam path, i.e. primary sub-beams 211, 212, 213. The image forming element array may, for example, comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may, for example, comprise a field curvature compensator array (not shown) and an astigmatism compensator array (not shown). The field curvature compensator array may, for example, comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to define the diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power (collimating power) of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams.

Objective lens 231 may be configured to focus sub-beams 211, 212, and 213 onto the sample 208 for inspection and, in the current example, may form three probe spots 221, 222, and 223 on the surface of sample 208.

Beam separator 233 may be, for example, a Wien filter comprising an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. In some embodiments, the electrostatic force is equal in magnitude but opposite in direction to the magnetic force exerted by magnetic dipole field of beam separator 233 on the individual primary electrons of the primary sub-beams 211, 212, and 213. Primary sub-beams 211, 212, and 213 may therefore pass at least substantially straight through beam separator 233 with at least substantially zero deflection angles. The direction of the magnetic force depends on the direction of motion of the electrons while the direction of the electrostatic force does not depend on the direction of motion of the electrons. So because the secondary electrons and backscattered electrons generally move in an opposite direction compared to the primary electrons, the magnetic force exerted on the secondary electrons and backscattered electrons will no longer cancel the electrostatic force and as a result the secondary electrons and backscattered electrons moving through the beam separator 233 will be deflected away from the optical axis 204.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. In the current example, the secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may, for example, be the separate detection elements 241, 242, and 243 that are arranged to detect corresponding secondary electron beams 261, 262, and 263. The detection regions may generate corresponding signals which are, for example, sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled to the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, may be used in combination with corresponding scan path data of each of primary sub-beams 211, 212, and 213 incident on the sample surface, to reconstruct images of the sample structures under inspection. The reconstructed images may be used to reveal various features of the internal or external structures of sample 208. The reconstructed images m thereby be used to reveal any defects that may exist in the sample.

The controller 50 may, e.g. further control the motorized stage 209 to move the sample 208 during, before or after inspection of the sample 208. In some embodiments, the controller 50 may enable the motorized stage 209 to move sample 208 in a direction, e.g. continuously, for example at a constant speed, at least during sample inspection. The controller 50 may control movement of the motorized stage 209 so that the speed of the movement of the sample 208 changes, e.g. dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
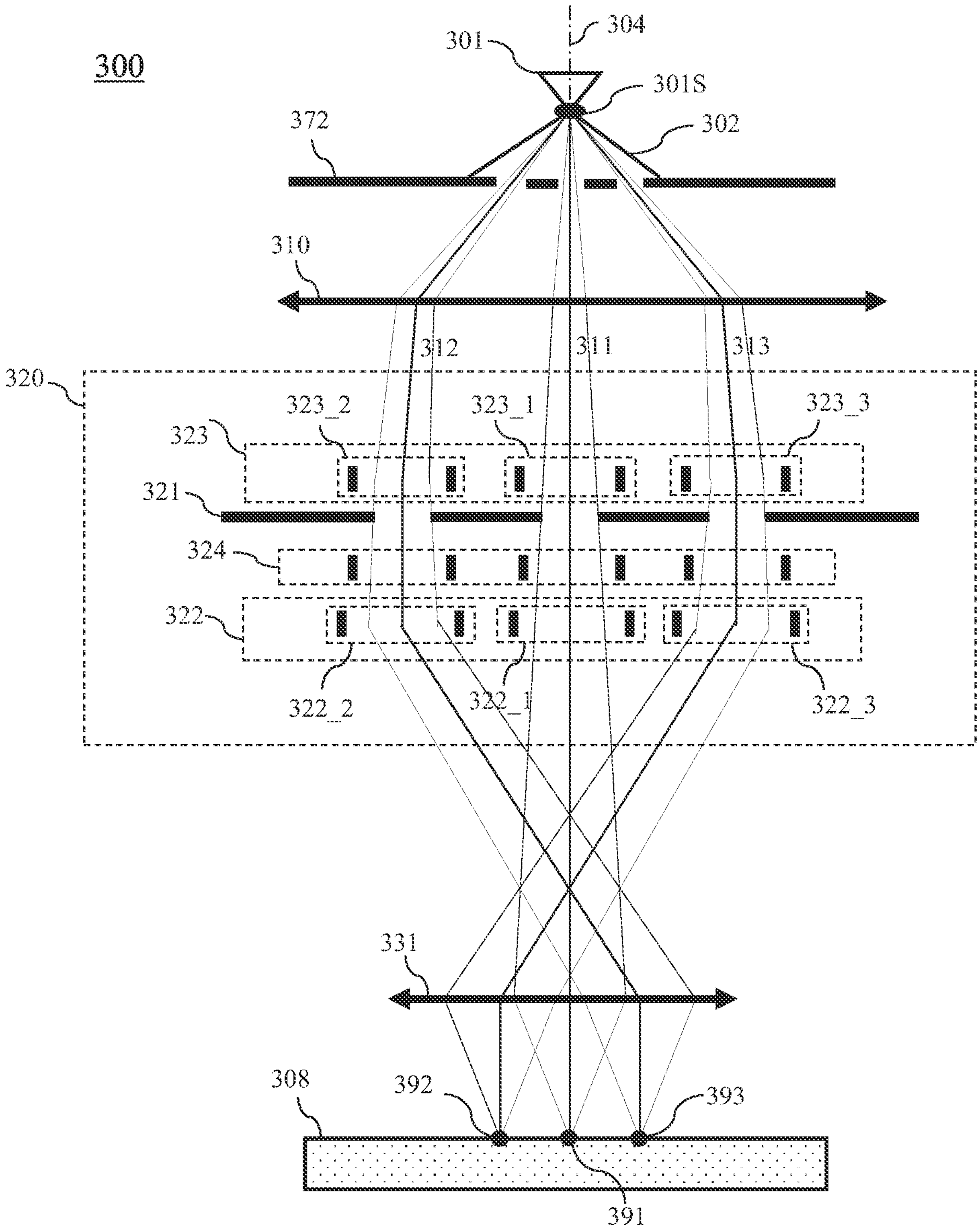
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372 (further also referred to as coulomb aperture array 372), a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, the coulomb aperture array 372, the condenser lens 310 may be the components of an illumination apparatus comprised by the apparatus 300. The source conversion unit 320 and objective lens 331 may be the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the coulomb aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The coulomb aperture array 372 cuts the peripheral electrons of primary electron beam 302 to reduce a consequential Coulomb effect. The primary-electron beam 302 may be trimmed into a specified number of sub-beams, such as three sub-beams 311, 312 and 313, by the coulomb aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to define the outer dimensions of the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 3222, and 322_3 are configured to deflect the paths of the sub-beams 311, 312, and 313 towards the electron-optical axis 304. The deflected sub-beams 311, 312 and 313 form virtual images (not shown) of source crossover 301S. In the current example, these virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations that may be present in each of the sub-beams. The aberration compensator array 324 may, for example, include a field curvature compensator array (not shown) with micro-lenses. The field curvature compensator and micro-lenses may, for example, be configured to compensate the individual sub-beams for field curvature aberrations evident in the probe spots, 391, 392, and 393. The aberration compensator array 324 may include an astigmatism compensator array (not shown) with micro-stigmators. The micro-stigmators may, for example, be controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 3232, and 323_3 may bend the path of the sub-beams onto the beamlet-limit aperture array 321. In some embodiments, the pre-bending micro-deflector array 323 may be configured to bend the sub-beam path of sub-beams towards the orthogonal of the plane of on beamlet-limit aperture array 321. In an alternative example the condenser lens 310 may adjust the path direction of the sub-beams onto the beamlet-limit aperture array 321. The condenser lens 310 may, for example, focus (collimate) the three sub-beams 311, 312, and 313 to become substantially parallel beams along primary electron-optical axis 304, so that the three sub-beams 311, 312, and 313 incident substantially perpendicularly onto source conversion unit 320, which may correspond to the beamlet-limit aperture array 321. In such alternative example the pre-bending micro-deflector array 323 may not be necessary.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In the current example of the source conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. In some embodiments, the deflection angles of sub-beams 311 to 313 are adjusted to pass through or approach the front focal point of objective lens 331 to reduce or limit the off-axis aberrations of three probe spots 391 to 393.

In the example of a multi-beam inspection tool 300 as shown in FIG. 3 the beam path of the secondary electrons, beam separator (similar as Wien filter 233), secondary projection optics (similar as secondary projection optics 250 of FIG. 2) and electron detection device (similar as electron detection device 240) have been omitted for clarity reasons. Is should be clear however that similar beam separator, secondary projection optics and electron detection device may be present in the current example of FIG. 3 to register and generate an image of the sample surface using the secondary electrons or backscattered electrons.

At least some of the above-described components in FIG. 2 and FIG. 3 may individually, or in combination with each other, be referred to as a manipulator array, or manipulator, because they manipulate one or more beams, or sub-beams, of charged particles.

The above described embodiments of multi-beam inspection tools comprise a multi-beam charged particle apparatus, that may be referred to as a multi-beam charged particle optical apparatus, with a single source of charged particles. The multi-beam charged particle apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample may be scanned with the multi-beam of charged particles.

A multi-beam charged particle apparatus comprises one or more electron-optical devices for manipulating the sub-beams of the multi-beam of charged particles. The applied manipulation may be, for example, a deflection of the paths of sub-beams and/or a focusing operation applied to the sub-beams. The one or more electron-optical devices may comprise MEMS.

The charged particle apparatus may comprise beam path manipulators located up-beam of the electron-optical device and, optionally, in the electron-optical device. Beam paths may be manipulated linearly in directions orthogonal to the charged particle axis, i.e. optical axis, by, for example, two electrostatic deflector sets operating across the whole beam. The two electrostatic deflector sets may be configured to deflect the beam path in orthogonal directions. Each electrostatic deflector set may comprise two electrostatic deflectors located sequentially along the beam path. The first electrostatic deflector of each set applies a correcting deflection, and the second electrostatic deflector restores the beam to the correct angle of incidence on the electron-optical device. The correcting deflection applied by the first electrostatic deflector may be an over correction so that the second electrostatic deflector can apply a deflection for ensuring the desired angle of incidence to the MEMS. The location of the electrostatic deflector sets could be at a number of locations up-beam of the electron-optical device. Beam paths may be manipulated rotationally. Rotational corrections may be applied by a magnetic lens. Rotational corrections may additionally, or alternatively, be achieved by an existing magnetic lens such as the condenser lens arrangement.

Embodiments of charged particle apparatus may comprise alternative and/or additional components on a charged particle path, such as further lenses and other components, from what is shown in, and described earlier with reference to, FIGS. 1 to 3. In particular, embodiments also include a charged particle projection apparatus that divides a charged particle beam from a source into a plurality of sub-beams. A plurality of respective objective lenses may project the sub-beams onto a sample. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may additionally, or alternatively, be integrated into, or positioned directly adjacent to, the condenser lenses and/or positioned in, or directly adjacent to, the intermediate foci. A detector is provided to detect charged particles emitted by the sample. The detector may be integrated into the objective lens. The detector may be on the bottom surface of the objective lens so as to face a sample in use. The condenser lenses, objective lenses and/or detector may be formed as MEMS or CMOS devices.

Embodiments of charged particle apparatus may also be implemented with a flood column. The flood column may be used to pre-charge the surface of the sample 208 and set the charging conditions. For example the flood column may pre-charge the surface of the sample 208 prior to inspection by the charged particle inspection apparatus. This may enhance the voltage contrast defect signal, so as to increase the defect detection sensitivity and/or throughput of the charged particle inspection apparatus. A flood column may have a large beam current, as required for quickly flooding, i.e. charging, a sample. The flood column may be used to provide a relatively large amount of charged particles to charge a predefined area. Afterwards, the charged particle inspection apparatus may scan the pre-charged area of the sample 208 to achieve imaging of the area.

The motorized stage 209 may move the sample 208 from a position for charged particle flooding by the flood column to a position for inspection by the charged particle inspection apparatus. Put another way, the motorized stage 209 may be used to move the sample 208 into the position for charged particle flooding. The flood column may then flood the sample 208 with charged particles. The motorized stage 209 may then be used to move the sample 208 into the position for inspection. The charged particle inspection apparatus may then be used to inspect the sample 208. Alternatively, the flood column may be part of the charged particle apparatus. The position for charged particle flooding by the flood column may coincide with the position for inspection by the charged particle inspection apparatus 200. The sample 208 and the motorized stage 209 may therefore remain substantially in place after charged particle flooding and before inspection.

The flood column may be integrated with, or mechanically coupled to, the charged particle inspection apparatus. There may be an interface between the flood column and the primary column of the charged particle inspection apparatus.

Advancements in the design of charged particle apparatuses include increasing the number of components in a charged particle apparatus. For example, the number of sources may be increased in order to increase the number of beams in a multi-beam of charged particles that may be provided. The number of lenses, and other charged particle manipulators, may also need to be increased so that the increased number of source beams may be appropriately manipulated. Charged particle apparatuses therefore need to comprise more components and these need to be integrated into the architecture of the charged particle apparatus. In particular, a flood column may need to be integrated with a SEM.

A problem caused by the above-identified advancements is that the available volume within a charged particle apparatus for some, or all, of the components is limited. A component that may be affected by these space restrictions is the power interface of a high voltage power supply to the charged particle apparatus. The high voltage power supply may be required, for example, by one or more sources within a flood column, SEM and/or other type of charged particle apparatus. A power interface may comprise a connector and a feedthrough. The connector may alternatively be referred to as a power connector. The connector may comprise one or more pins that are connected to a high voltage power supply. The feedthrough may alternatively be referred to as a feedthrough connector. The feedthrough may be located in, or on, an outer wall of a charged particle apparatus. The feedthrough may be attachable to the connector so that a charged particle apparatus is provided with a high voltage power supply. The feedthrough may also be detachable from the connector.

When the feedthrough and connector are attached to each other to provide a power interface, there is a boundary surface defined between the abutting surfaces of the feedthrough and the connector. An end of a boundary surface may be at an electrically conductive surface of the power supply. The other end of the boundary surface may be at another electrically conductive surface of the power supply, such as on a different power supply pin, or the grounded outer housing of the charged particle apparatus. The distance between these ends, along a boundary surface, defines a creep length. The creep length should be greater than the distance along a boundary surface between two conductors at which electrical breakdown and/or flashover may occur between the conductors, i.e. a minimum creep length. An electrical breakdown and/or flashover is dangerous and may damage the charged particle apparatus and/or the power supply. The stability of the charged particle apparatus may also be adversely affected. The minimum distance that the creep length between two conductors should be greater than is dependent on the potential difference between the conductors, the surface properties of the materials and design of the boundary surface. The minimum distance is therefore dependent on the application of the power interface.

When the feedthrough and connector are detached from each other, the creep length requirement should still be met by the connector. The creep length distance between an exposed electrically conductive surface of the power supply and another electrically conductive surface must be greater than the minimum creep length distance required to avoid an electrical breakdown. Another condition that should be satisfied is that electrical flashover should not occur between an electrically conductive surface of the connector and any object that may be in the vicinity of the electrically conductive surface. For example, flashover should not occur to a user's hand, or other object, placed over the end of the connector.

In known designs of high voltage connectors, appropriate minimum distances for creep lengths along each boundary surface are ensured by providing substantial lateral spacing between each conductive surface of a power supply and the nearby electrically conductive surfaces. The requirement to provide a substantial lateral spacing conflicts with the restricted area available in the outer wall of, or volume available in, the charged particle apparatus for the feedthrough.

Embodiments provide a new design of power interface for a charged particle apparatus. The feedthrough and connector are designed so that the boundary surface, that is a creep length distance, is bi-directional in directions parallel to each power supply wire/pin. Preferably the boundary surface of the connector substantially extends into a body of the connector. This reduces the minimum required lateral spacing between each power supply wire/pin and the nearby grounded surfaces, as well as between adjacent wires/pins. The required area for the feedthrough in an outer wall of the charged particle apparatus is reduced. The volume required in the charged particle apparatus to accommodate the feedthrough may also be reduced.

Figure 4:
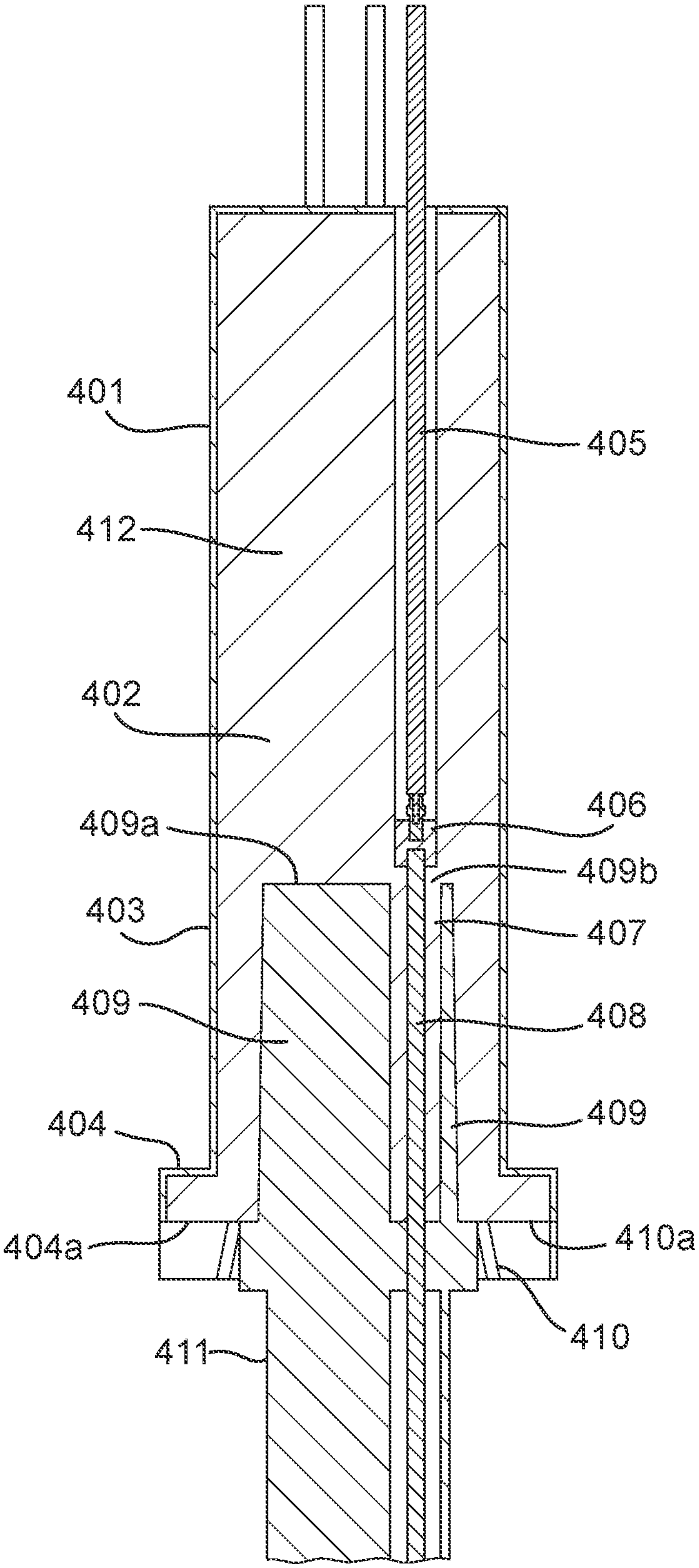
FIG. 4 is a schematic diagram of a cross-section through a power interface according to some embodiments of the present disclosure.

FIG. 4 shows a schematic diagram of a cross-section through a power interface according to some embodiments. The power interface comprises a connector 401 that is a high voltage power connector 401 according to some embodiments. The power interface also comprises a feedthrough 411 that is a high voltage feedthrough connector 411 according to some embodiments. In FIG. 4, the connector 401 is shown connected to the feedthrough 411.

The connector 401 has a metal outer housing 403. Within the housing is a connector insulating structure 402, which may also be referred to as a connector insulator 402. The connector insulating structure 402 may be a single solid body. The connector insulating structure 402 may be an electrical insulator, such as Polytetrafluoroethylene (PTFE). The connector insulating structure 402 may comprise a base 412 and one or more elongate tubular structures 407 that each extend from the base 412. The tubular structures 407 may be cylindrical hollow structures, conical hollow structures, or have any other outer form so long as each can have flush surfaces with a corresponding opening in a feedthrough insulating structure 409 (as described later). Each tubular structure 407 is hollow to the extent that it comprises a channel 415 (not shown in FIG. 4; shown in FIG. 6) for receiving a feedthrough pin 408. Each channel 415 of a tubular structure 407 may be linear. Each channel 415 of a tubular structure 407 may comprise an open end for receiving a feedthrough pin 408 and a closed end that is recessed with in the connector insulating structure 402. Each channel 415 may extend into the base of the connector insulating structure 402 so that the length of the channel 415 is longer than the length of the tubular structure 407 that defines part of the channel 415. The tubular structures 407 may be integrated into the design of the connector insulating structure 402. In some embodiments, the channels may be defined in the connector insulating structure 402. In some embodiments, the channels may be a feature of the connector insulating structure 402.

The connector 401 comprises one or more connector wire assemblies, which may be referred to as, and optionally take the form of, connector pins. In some embodiments, a connector wire assembly comprises a wire 405 and a plug 406 arranged on the end of the wire 405. The plug 406 may be at the closed end of a channel and thereby recessed into the connector insulating structure 402. The plug 406 may be recessed into the closed end of the channel. The wire 405 may be connected to a high voltage power supply. The wire 405 may, for example, be a commercially available wire with its outer jacket and braiding stripped back. Potting material may be provided between the wire 405 and the connector insulating structure 402. The housing 403 is electrically insulated from each wire 405 at least by the connector insulating structure 402.

The feedthrough 411 comprises a feedthrough insulating structure 409. The feedthrough insulating structure 409, that may also be referred to as a feedthrough insulator 409, may be a single solid body. The feedthrough insulating structure 409 may be an electrical insulator, such as $Al_2O_3$. An advantage of using $Al_2O_3$ is that it may be fixed, e.g. brazed, in a leak tight way to a flange on the housing of a charged particle apparatus. This is preferable over the use of a plastic that cannot be brazed. A plastic feedthrough insulating structure 409 could be glued to a charged particle apparatus but the glue would be more likely to fail over time. Plastics can also gas out when directly exposed to a vacuum and reduce the quality of the vacuum. Unlike $Al_2O_3$, plastics may also degrade, or melt, during a bake out process to improve the vacuum. It should be noted that the connector 401 may be detached from the feedthrough 411 during such a bake out process and so the use PTFE is possible in the connector insulating structure 402. In addition, as described in more detail later, the feedthrough insulating structure 409 and connector insulating structure 402 engage with each other. The engagement between a soft PTFE and hard $Al_2O_3$ materials may be more robust than an engagement between two hard materials that may damage each other.

The feedthrough insulating structure 409 has an outermost end surface 409*a* and comprises one or more openings 409*b* that may be defined in the outermost end surface 409*a*. An opening 409*b* may define a recess, which may be cylindrically shaped, that extends into the feedthrough insulating structure 409 from the outermost end surface 409*a*. The opening 409*b* may define a feedthrough channel within the feedthrough insulating structure.

The feedthrough 411 comprises one or more feedthrough pins 408. A feedthrough pin 408 may be arranged within one of the feedthrough channels in the feedthrough insulating structure 409. Each feedthrough pin 408 may be linear, for example straight/cylindrical. The cross-section of a feedthrough pin 408 may be of similar shape to the cross-section of a channel of a tubular structure 407 of the connector 401. The end of a feedthrough pin 408 may be arranged so that is received in a press fit by a corresponding plug 406 of the connector 401. The feedthrough pin 408 may extend, i.e. protrude out a corresponding feedthrough channel. An end of each feedthrough pin 408 may protrude from the feedthrough insulating structure 409. This enables the feedthrough pin 408 to engage with the corresponding plug without interference of volume conflict with the feedthrough insulating structure 409. That is the feedthrough pin engages with the corresponding plug within the insulating structure 409. The one or more feedthrough pins 408 may thereby electrically connected to respective one or more wires 405 to provide a high voltage power supply to a charged particle apparatus.

The connector 401 may have a flange 404. The flange 404 may be used to secure, such as bolt, the connector 401 to an outer wall of a charged particle apparatus. The securing of the flange 404 to the outer wall is sealed. The flange 404 may have an end surface 404*a* that may substantially consist of an end surface of the connector insulator structure 402. The part of the charged particle apparatus that the flange 404 of the connector 401 is secured to may be part of a housing of the feedthrough 411, such as a corresponding feedthrough flange 410. The end surface 404*a* of the connector 401 may face and contact a corresponding end surface 410*a* of the feedthrough flange 410. The housing of the feedthrough 411 may be electrically insulated from each feedthrough pin 408 by at least the feedthrough insulating structure 409.

The feedthrough insulating structure 409 is insertably engageable with the connector insulating structure 402. Each opening 409*b* of the feedthrough insulating structure 409 is arranged, i.e. shaped, to receive a tubular structure 407 of the connector insulating structure 402. The feedthrough channel may be cylindrical, conical or have any other shape so that it can receive a tubular structure 407 of the connector insulating structure 402. The feedthrough channel may have a cross-section which may be shaped to be circular or any other shape.

The connector insulating structure 402 is also insertably engageable with the feedthrough insulating structure 409. Each feedthrough pin 408 is received by an opening in a corresponding tubular structure 407 that is a channel for the feedthrough pin 408. The cross-sections of a channel and a corresponding pin may be substantially the same. The end of each feedthrough pin 408 may be received by a plug 406 so that the feedthrough pin 408 is electrically connected to a corresponding wire 405.

When the connector 401 and the feedthrough 411 are connected, there may a tight fit between the feedthrough insulating structure 409 and the connector insulating structure 402. That is to say, there may be a substantially tight fit, i.e. substantially no gaps or marginal gaps, between the feedthrough insulating structure 409 and the connector insulating structure 402. There may also be a substantially a tight fit, i.e. substantially no gaps or marginal gaps, between each feedthrough pin 408 and the tubular structure 407 that receives it. The engagement of the connector 401 and the feedthrough 411 may therefore exclude substantially all of the air from within the connection power interface.

Figure 5:
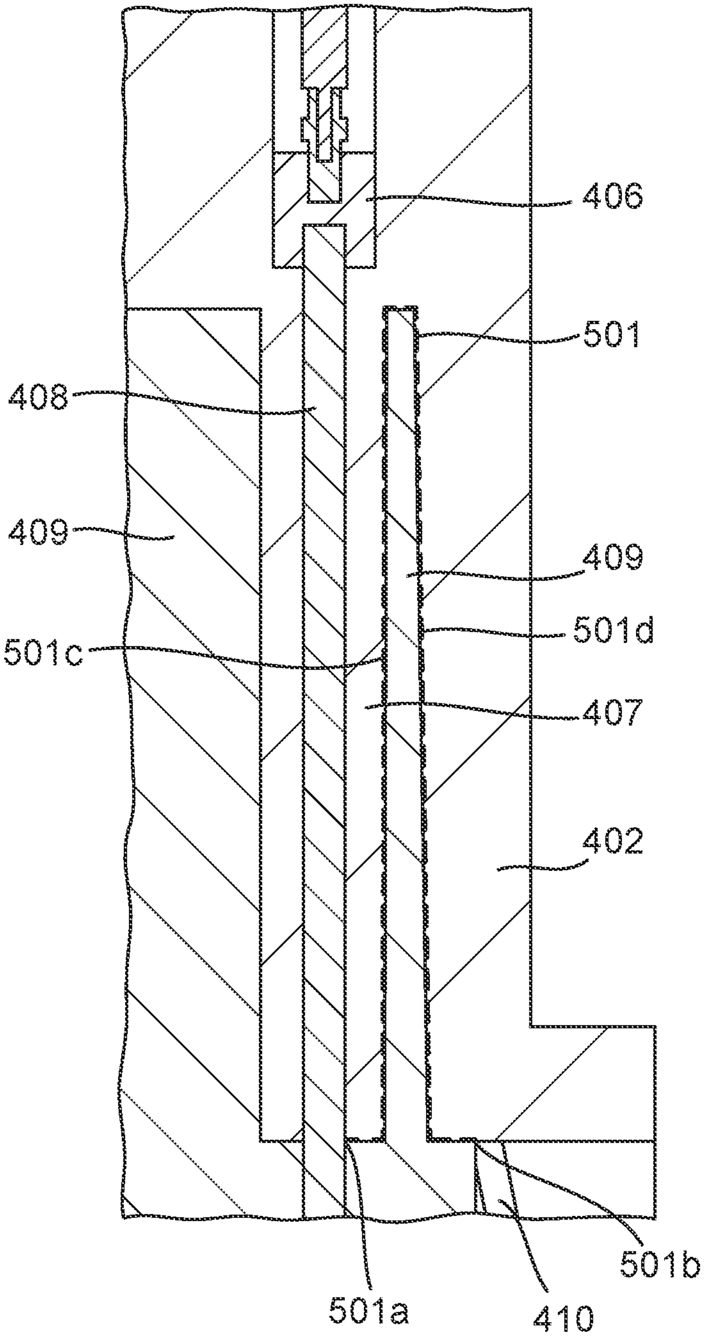
FIG. 5 is a schematic diagram of a cross-section through a power interface according to some embodiments of the present disclosure.

FIG. 5 shows a boundary surface 501 of the connector 401 at the interface between the feedthrough insulating structure 409 and the connector insulating structure 402 according to the embodiment shown in FIG. 4. The boundary surface 501 is a creep length distance. The creep length distance should exceed a minimum creep length for the design over an operating potential difference range. A first end 501*a* of the boundary surface 501 is a conductive surface of a feedthrough pin 408. A second end 501*b* of the boundary surface is a grounded part of the charged particle apparatus 410. The boundary surface of the connector substantially extends into the connector insulating structure. 409.

The boundary surface 501, at least with respect to the connector, extends substantially bi-directionally in directions parallel to the longitudinal axis of the feedthrough pin 408. A first part 501*c* of the boundary surface 501, that is parallel to the longitudinal axis of the feedthrough pin 408, is along the outer surface of the tubular structure 407 that the feedthrough pin 408 is inserted into. A second part 501*d* of the boundary surface 501, that is substantially parallel to the longitudinal axis of the feedthrough pin 408, is along a facing surface of the connector insulating structure 402. The first end 501*a* and second end 501*b* of the boundary surface are laterally spaced apart from each other with the boundary surface 501 extending from a conductive surface of the feedthrough pin 408 towards the perimeter of an end surface of the connector insulating structure 402. The substantial lengths of the boundary surface are the bi-directional first part 501*c* and second part 501*d*.

The feedthrough 411 has a corresponding boundary surface that abuts the boundary surface 501 of the connector 401. Accordingly, the interface between the feedthrough insulating structure 409 and the connector insulating structure 402 has the same above described property of bi-directional parts parallel to the longitudinal axis of the feedthrough pin 408.

Advantageously, the above-described arrangement of bi-directional parts 501*c*, 501*d* of a boundary surface 501 allow the lateral spacing between the ends 501*a*, 501*b* of the boundary surface to be less than that of known feedthroughs required to have a creep length distance that is larger than a similar minimum creep length.

Figure 6:
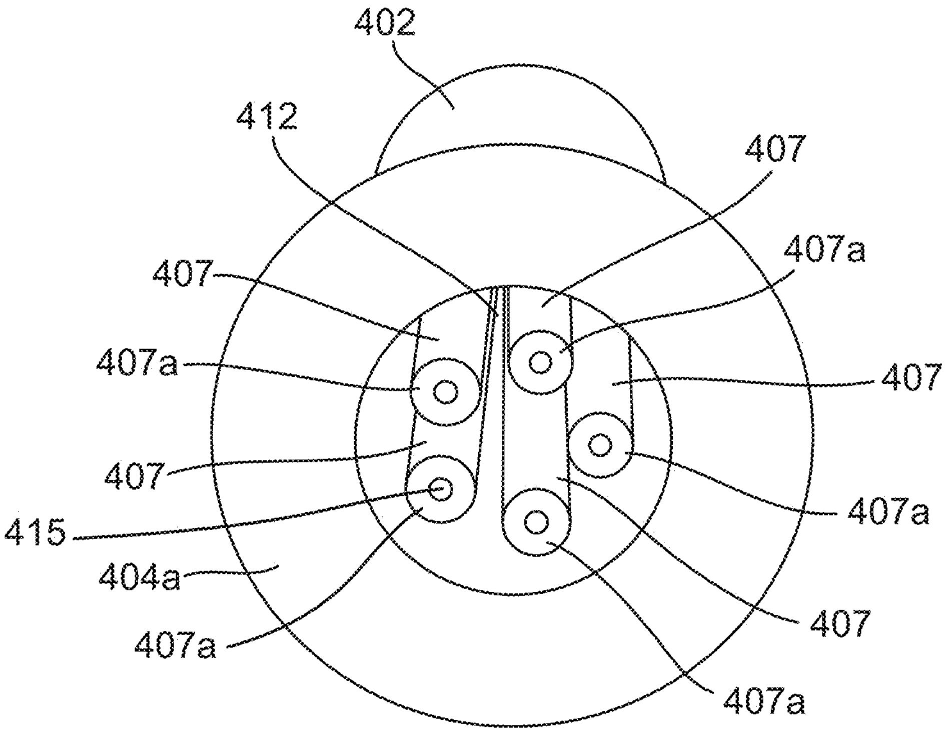
FIG. 6 is a schematic view of a connector insulating structure for use with a feedthrough according to some embodiments of the present disclosure.

It is also noted that in an example the length of the distance that the boundary surface 501 of the connector 401 recesses into the connector insulating structure 402, for example the lengths of the bi-directional first part 501*c* and 501*d*, is less than the distance that the plug is recessed into the connector insulating structure 402 relative to the end surface 404*a* of the connector 401. The plug 406 may be recessed into the connector insulating structure 402 further than the boundary surface 501, as depicted in FIG. 5. That is the length of the channel in the connector insulating structure 402, for example between the end of the end surface 404*a* of the connector 401 and the closed end of the channel, may be more than the length of the boundary surface into the connector insulating structure 402, for example which may correspond substantially to the length of the first part 501*c* of the boundary surface 501 or the second part 501*d* of the boundary surface 501. The boundary surface of the connector extends into the connector insulating structure 402. The boundary end surface 404 has an outer perimeter which may be furthest extent of the flange 401 from the channels in the insulating structure of the connector. The boundary surface may interpose between the outer perimeter of the end surface and the channels defined in the end surface. Thus the boundary surface of the connector may extend into the insulating structure in the end surface of the end surface of the connector around the channels, e.g. also the tubular structures, for example as depicted in FIGS. 5 and 6.

As described in more detail later, when the connector 401 and feedthrough 411 are detached from each other, the distance along a channel between each plug 406 and the end surface 410*a* may be greater than the distance at which flashover may occur between the plug 406 and an electrically conductive object at the end surface 404*a* of the connector 401. That is the distance along a channel between each plug 406 and the end surface 410*a* of the feedthrough flange may be greater than the distance between the plug 406 and an electrically conductive object at the end surface 404*a* of the connector 401 This reduces the risk of such a flashover occurring if a high voltage power supply is provided to the connector 401 when the connector is disconnected from the feedthrough 411. The creep length distance along a surface of the connector insulating structure 402 may also be longer than the distance over which electrical breakdown may occur to an electrically conductive object at the end surface 404*a*, i.e. a minimum creep length. The recessing of the plug 406 into the connector insulator structure 402, preferably into the surface of the closed end of the channel, therefore improves the safety of the connector 401.

Provided below are further descriptions of details that implementations of components of a power interface according to embodiments may include.

Embodiments include a power interface with a single wire/pin. The feedthrough 411 may comprise only a single feedthrough pin 408. The corresponding connector 401 may comprise only a single connector wire assembly, i.e. a single wire with a plug on its end.

Embodiments also include a power interface with a plurality of wires/pins. The feedthrough 411 may comprise a plurality of feedthrough pins 408. The connector 401 may comprise a respective plurality of connector wire assemblies. For example, the number of feedthrough pins 408, or wires 405, may be 1 to 10. In a preferred embodiment, the number of feedthrough pins 408, or wires 405, may be 2 or 5.

When the feedthrough 411 comprises a plurality of feedthrough pins 408 and connector wire assemblies, a further condition should be met by each boundary surface that is a creep length distance. The creep length distances between any two conductive surfaces of different feedthrough pins 408 and/or connector wire assemblies should be longer than the lengths at which electrical breakdown occurs, i.e. a minimum creep length. This condition is met by the boundary surface between any two feedthrough pins 408 and/or connector wire assemblies also being substantially bi-directional in directions parallel to the longitudinal axis of each feedthrough pin 408. This allows the lateral spacing between adjacent feedthrough pins 408 and connector wire assemblies to be less than that in known feedthroughs. The potential difference between different feedthrough pins 408 may be less than the potential difference between a feedthrough pin and ground. The minimum required creep length distance, i.e. minimum creep length, may therefore be less between different feedthrough pins 408 and connector wire assemblies.

FIG. 6 shows a schematic view of the connector insulating structure 402 for use with a feedthrough 411 with 5 feedthrough pins 408. Five tubular structures 407 protrude from the base 412 of the connector insulating structure 402. Each tubular structure 407 has an annular cross section with the central opening of the annular cross section being a linear channel that is arranged to receive a feedthrough pin 408. The tubular structures 407 have end portions 407*a* that may be coplanar with a flange end surface 404*a*. Embodiments also include a variation in which the end portions 407*a* are either recessed in, or protrude out of, the flange end surface 404*a*. Each channel has an open end that receives a feedthrough pin 408 and a closed end that is recessed within the connector insulating structure 402. As shown in FIGS. 4 and 5, at the closed end of each channel is a plug 406 of a connector wire assembly. Each plug 406 is thereby recessed within the connector insulating structure 402, preferably recessed within a surface of the closed end of channel.

The distance along a channel between each plug 406 and the end surface 404*a* of the connector 401 may be greater than the flashover distance between the plug 406 and an electrically conductive object at the end surface 404*a*. That is, the distance along a channel between each plug 406 and the end surface 404*a* of the connector 401 may be greater than the distance between the plug 406 and an electrically conductive object at the end surface 404*a*. This reduces the risk of such a flashover occurring if a high voltage power supply is provided to the connector 401 when the connector is disconnected from the feedthrough 411. The creep length distance along a surface of the connector insulating structure 402 may also be longer than the distance over which electrical breakdown may occur to an electrically conductive object at the end surface 404*a*, i.e. a minimum creep length.

Figure 7A:
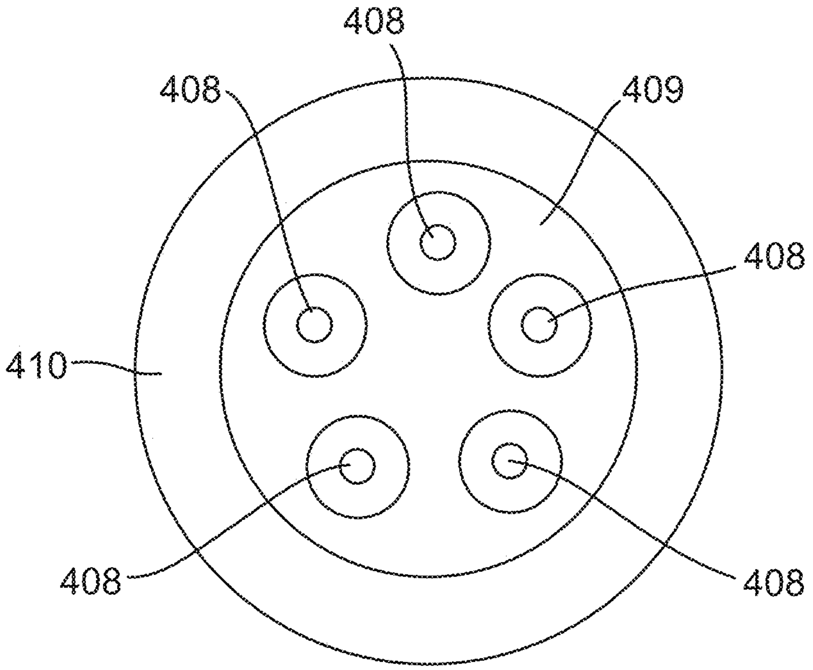
FIG. 7A is a substantial end on view of a feedthrough according to some embodiments of the present disclosure.
Figure 7B:
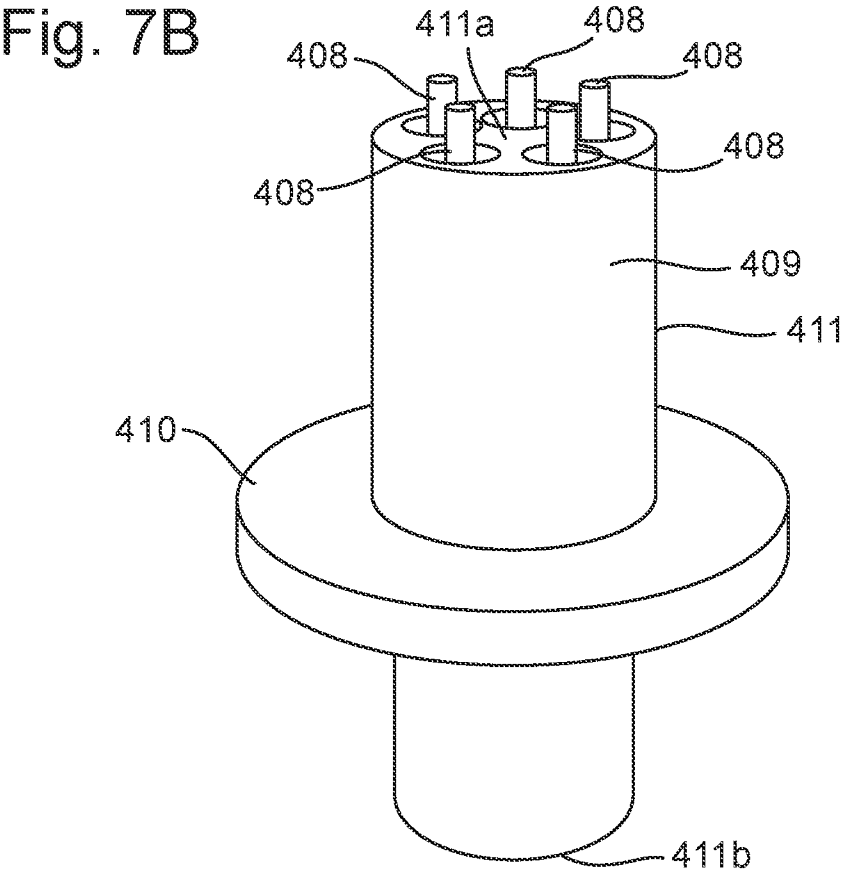
FIG. 7B is a substantial side on view of a feedthrough according to some embodiments of the present disclosure.
Figure 7C:
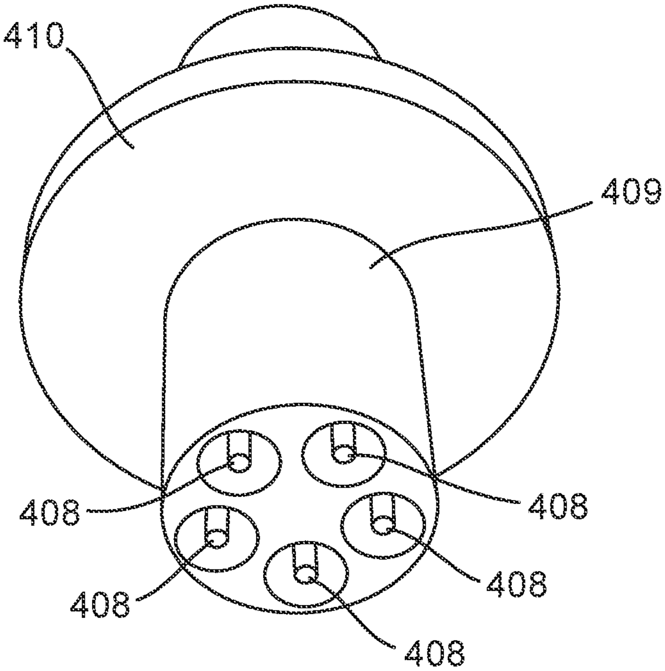
FIG. 7C is a view of the end of a feedthrough according to some embodiments of the present disclosure.

FIGS. 7A, 7B and 7C show different schematic views of a feedthrough 411 with 5 feedthrough pins 408. FIG. 7A is a substantial end on view along the longitudinal axis of one of the feedthrough pins 408. The shown end of the feedthrough 411 is the end that is received by a connector 401. FIG. 7B is a substantial side on view of the feedthrough 411. FIG. 7C is another view of the end of the feedthrough 411 that is received by a connector 401.

For each of the feedthrough pins 408, the feedthrough insulating structure 409 comprises a respective opening that extends into the feedthrough insulating structure 409 from an end surface of the feedthrough insulating structure 409. Each opening may be cylindrical, be conical, or have any other shape, so long as the opening corresponds to the outer form of the tubular structure 407 of the connector 401 that it is arranged to receive. Each feedthrough pin 408 is arranged within one of the openings in the feedthrough insulating structure 409. The end of each feedthrough pin 408 may protrude from the feedthrough insulating structure 409. In a plane that is orthogonal to the longitudinal axis of one of the feedthrough pins 408, the feedthrough insulating structure 409 may be surrounded by a part 410 of the charged particle apparatus that the flange 404 of the connector 401 is secured to. The part 410 of the charged particle apparatus that the flange 404 of the connector 401 is secured to may be a flange of the feedthrough 411. The flange 404 of the connector 401 may be bolted to the charged particle apparatus.

Figure 8:
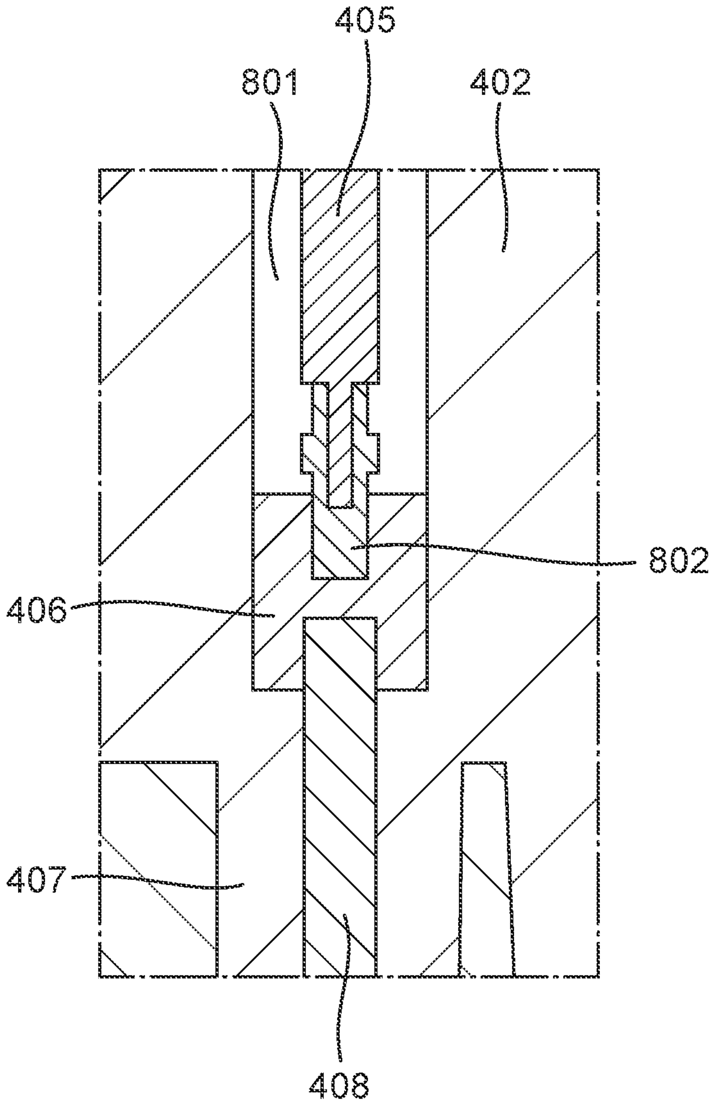
FIG. 8 shows the connection between the end of a feedthrough pin and a plug according to some embodiments of the present disclosure.

FIG. 8 shows the connection between the end of a feedthrough pin 408 and a plug 406. The end of the feedthrough pin 408 may be press fitted into the plug 406. The plug 406 may be secured to the end of a wire 405 by a crimp 802, or other attachment mechanism. That is the feedthrough pin engages with the corresponding plug within the insulating structure 409 The plug 406 may be recessed into the connector insulating structure further than the boundary surface 501, as depicted in FIG. 8. The closed end of the channel in the connector insulating structure may be further from the end surface of the connector than the length of the boundary surface into the insulating structure. The boundary surface of the connector substantially extends into the insulating structure. 402.

When the power connector 401 is manufactured, each wire may be provided within a channel 801 of the connector insulating structure 402 for receiving the wire 405. The channel 801 may then be filled with potting material so that there are no gaps between the wire and the connector insulating structure 402.

Figure 9B:
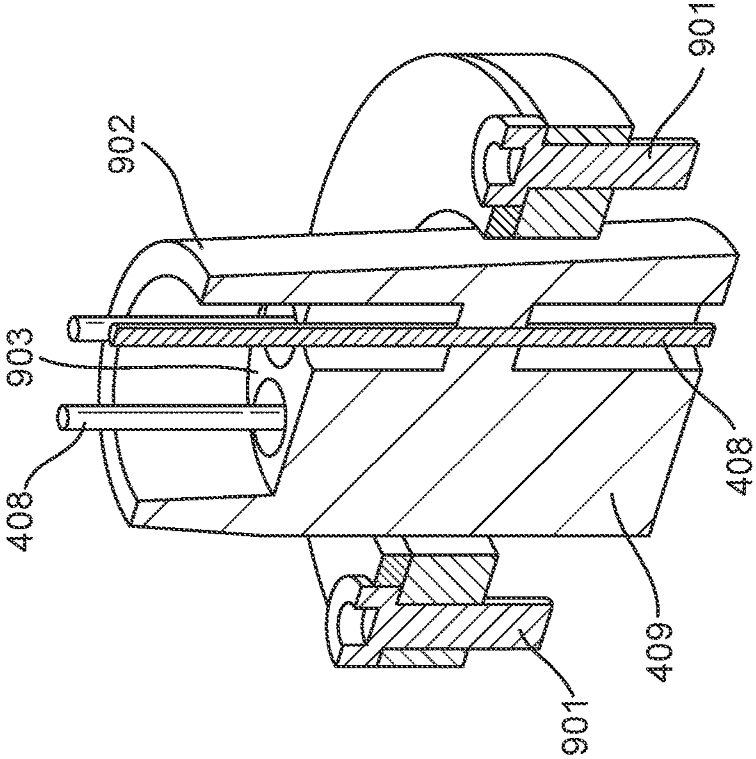
FIG. 9B shows a schematic diagram of a cross-section through a feedthrough according to some embodiments of the present disclosure.
Figure 9A:
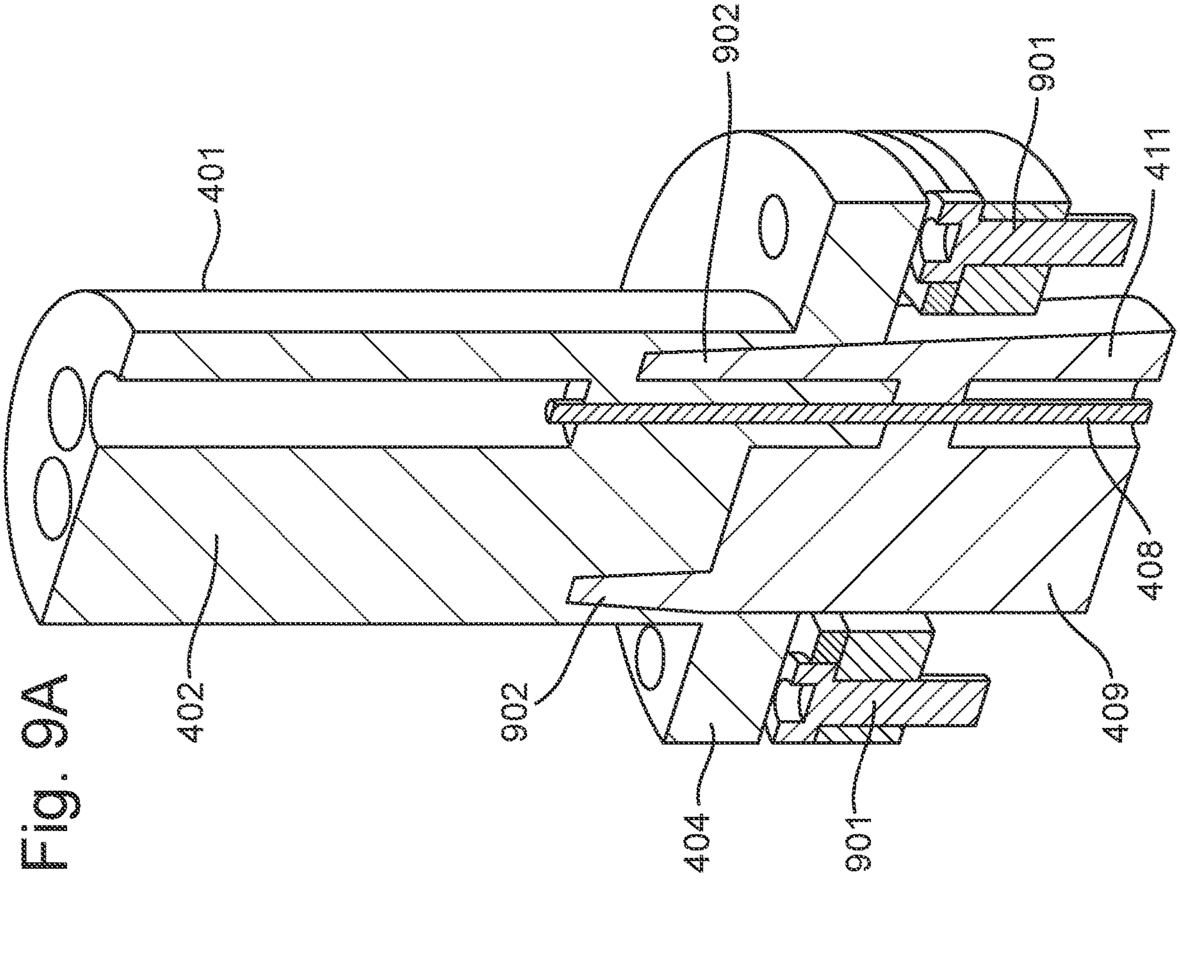
FIG. 9A is a schematic diagram of a cross-section through a power interface according to some embodiments of the present disclosure.

FIG. 9A shows a schematic diagram of a cross-section of a power interface according to some embodiments. Shown are the components of a high voltage connector 401 and a high voltage feedthrough 411 when they are connected to each other. FIG. 9B shows a schematic diagram of a cross-section of just the feedthrough 411 in the embodiment shown in FIG. 9A. In the embodiment shown in FIGS. 9A and 9B, the feedthrough 411 is a multi-pin feedthrough, although in another embodiment the feedthrough may have only a single pin.

The connector 401 shown in FIG. 9A, and the feedthrough 411 shown in FIGS. 9A and 9B, may comprise corresponding components to those described above with reference to FIGS. 4 to 8. Although not shown in FIGS. 9A and 9B, the connector 401 may comprise further features, such as those shown in FIGS. 4 to 8.

As shown in FIGS. 9A and 9B, the flange 404 of the connector 401 may be secured to the feedthrough 411 and/or charged particle apparatus by bolts 901. Although not shown in FIG. 9A, the flange 404 of the connector 401 may comprise one or more alignment pins for insertion into respective alignment openings of a feedthrough 411 and/or charged particle apparatus. Similarly, the flange 404 of the connector 401 may comprise one or more alignment openings for receiving respective alignment pins of a feedthrough 411 and/or charged particle apparatus.

As shown in FIGS. 9A and 9B, the feedthrough insulating structure 409 comprises a sleeve 902. The sleeve may be an integral part of the feedthrough insulating structure 409. In a plane orthogonal to the longitudinal axis of a feedthrough pin 408, the sleeve 902 may surround all of the feedthrough pins 408. The sleeve 902 may extend as a tubular portion further from the base of the feedthrough insulating structure 409 than the other parts of the feedthrough insulating structure 409, such as upper surface 903. The connector insulating structure 402 may comprise a corresponding opening for receiving the sleeve 902, and upper surface 902, such that there is a tight fit between the connector insulating structure 402 and the feedthrough insulating structure 409. The sleeve may increase the length over the boundary surface that is a creep length distance between a conductive surface of each feedthrough pin 408 and grounded surface, that may be part of the charged particle apparatus 410 or the housing of the connector. The potential difference between a feedthrough pin 408 and such a grounded surface may be greater than that between adjacent feedthrough pins. A longer distance along a boundary surface that is a creep length distance from a conductive surface of each feedthrough pin 408 to such a grounded surface may therefore be required.

Figure 10:
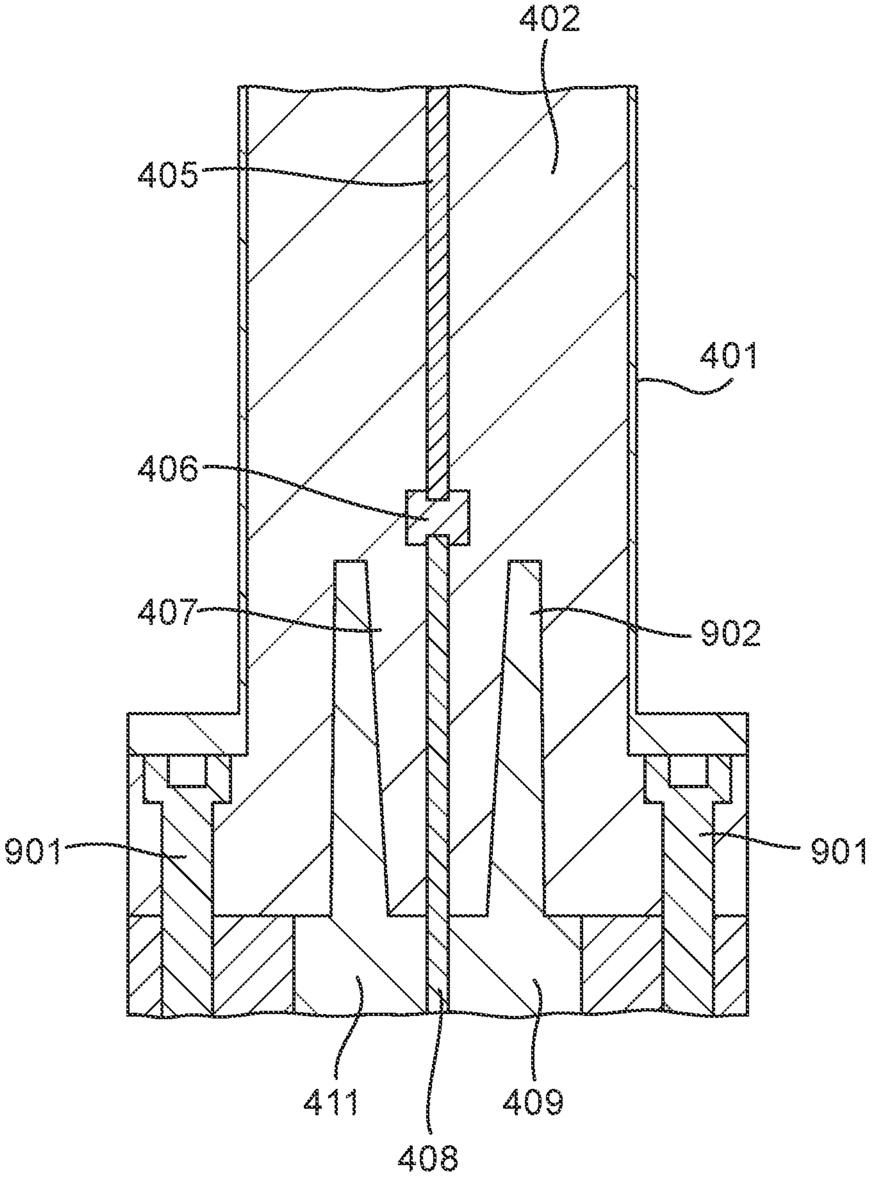
FIG. 10 is a schematic diagram of a cross-section through a power interface according to some embodiments of the present disclosure.

FIG. 10 shows a schematic diagram of a cross-section of a high voltage power interface according to some embodiments. The power interface comprises a high voltage connector 401 connected to a high voltage feedthrough 411. In the embodiment shown in FIG. 10, the feedthrough only has a single pin that is surrounded by a sleeve 902. The connector 401 comprises a single wire 405, a plug 406 and a single tubular structure 407 with a conical outer form. Although not shown in FIG. 10, the connector 401 may comprise further features, such as those shown in FIGS. 4 to 9B.

The feedthrough 411 comprises a single feedthrough pin 408 and a feedthrough insulating structure 409 shaped so as to receive the tubular structure 407 of the connector 401. Although not shown in FIG. 10, the feedthrough 411 may comprise further features, such as those shown in FIGS. 4 to 9.

As shown in FIG. 10, the connector may be secured to the feedthrough by bolts 901.

In the embodiment shown in FIG. 10, the volume of the feedthrough 411 on a charged particle apparatus may again be less than that of known techniques due to the provision of a bi-directional boundary surface between the feedthrough and the connector 401.

Figure 11A:
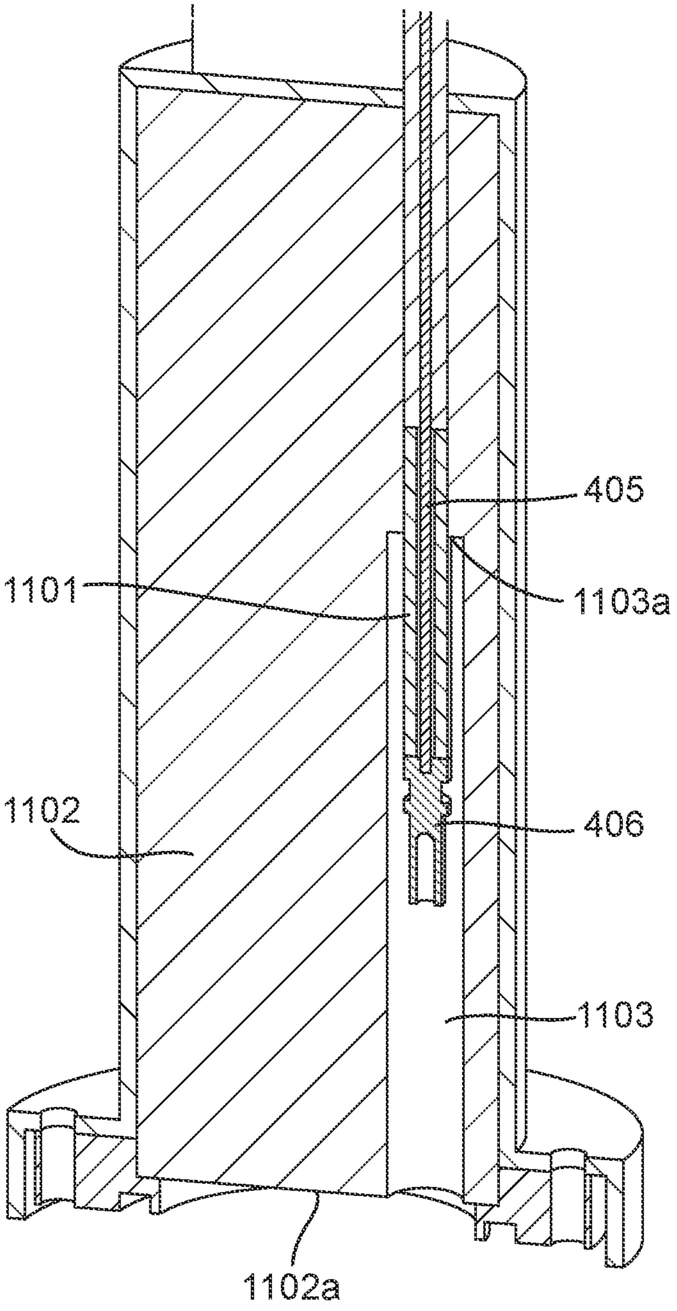
FIG. 11A is a schematic diagram of a cross-section through a connector according to some embodiments of the present disclosure.
Figure 11B:
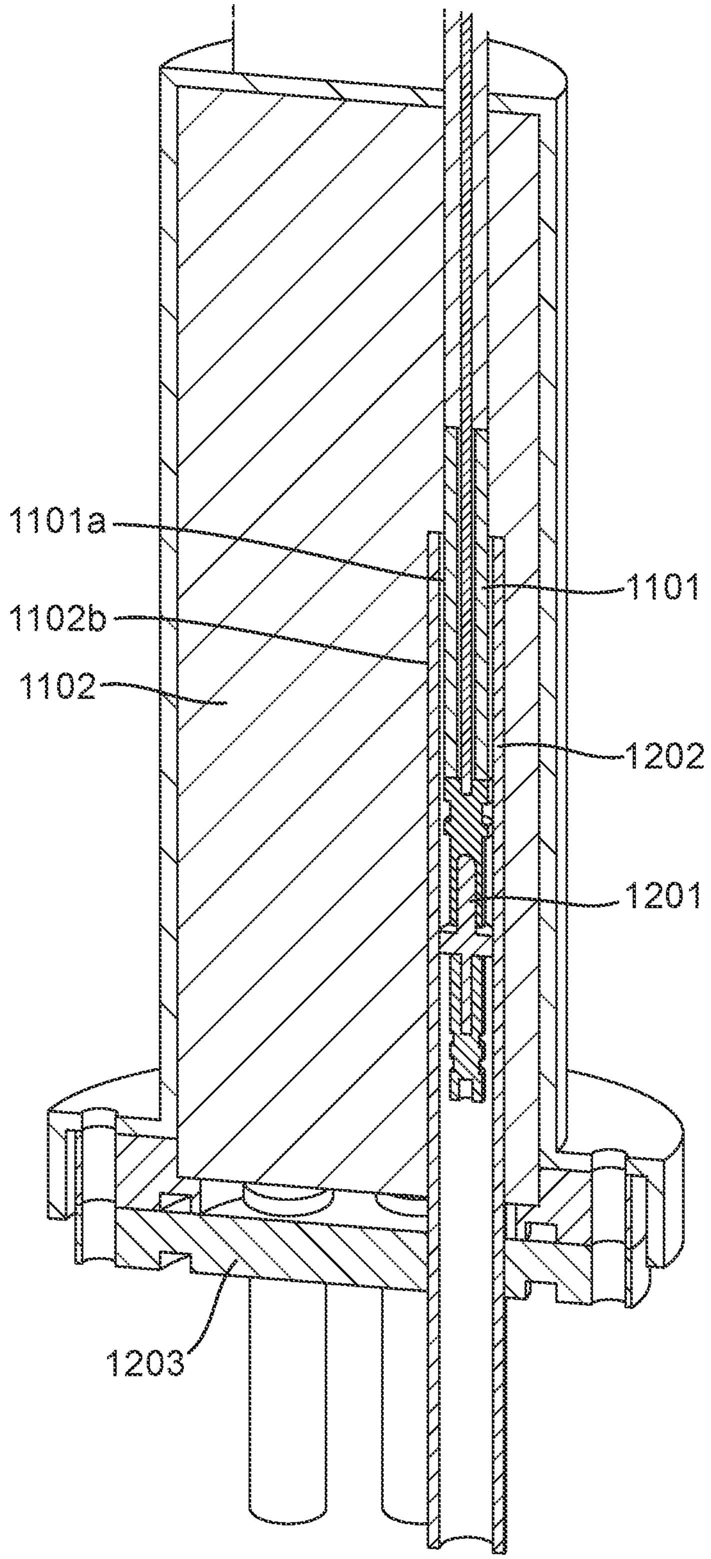
FIG. 11B is a schematic diagram of a cross-section through a power interface according to some embodiments of the present disclosure.

FIG. 11A shows a cross-section through a high voltage a connector of a high voltage power interface according to another embodiment. FIG. 11B shows a cross-section through the high voltage power interface when the connector shown in FIG. 11A is connected to a feedthrough of the power interface according to the present embodiment.

As shown in FIG. 11A, in the present embodiment the connector comprises a connector insulating body 1102. For each connector wire assembly, there is a channel 1103 extending into the connector insulating body 1102 from an end surface of the connector insulating body 1102 and the connector wire assembly is recessed within the channel 1103.

For each connector wire assembly, the connector insulating body 1102 may comprise a connector tubular structure 1101. Each connector tubular structure 1101 is an insulator. Each connector tubular structure 1101 surrounds at least part of a wire 405. The inner surface of each connector tubular structure 1101 may be in close contact with the wire 405 that the connector tubular structure 1101 surrounds so that there is a tight fit, i.e. no substantial gaps, between the connector tubular structure 1101 and the wire 405. At the end of the wire 405 is a plug 406. The plug 406 may not be surrounded by the connector tubular structure 1101. Each connector tubular structure 1101 is arranged to protrude from the closed end 1103*a* of a corresponding channel 1103. In a plane orthogonal to the longitudinal axis of each channel 1103, there may be a substantially annular gap between the connector tubular structure 1101 and the channel 1103.

In the present embodiment, the connector insulating body 1102 may therefore be a multi-part structure that comprises a main body and also one or more connector tubular structures 1101. The main body may be PTFE and each connector tubular structure 1101 may be, for example, ceramic. As shown in FIG. 11A, each connector tubular structure may extend all the way through the connector insulating body 1102 to a base of the connector.

As shown in FIG. 11B, the feedthrough of the present embodiment differs from that of the previous embodiments in that it comprises a feedthrough insulating structure 1202 for each of the feedthrough pins 1201. For a multi-pin feedthrough, the feedthrough therefore comprises a plurality of feedthrough insulating structures 1202. The feedthrough may comprise further parts and components form those shown in FIG. 11B. For example, in FIG. 11B only the end of a feedthrough pin 1201 is shown. However, the feedthrough may comprise a feedthrough pin 1201 that extends into the charged particle apparatus. There may be a tight fit between all components of the feedthrough. For example, there may be no gaps within each feedthrough insulating structure 1202, such as between the pin 1201 and the feedthrough insulating structure 1202.

In the present embodiment, each feedthrough insulating structure 1202 is a tubular structure that, in a plane orthogonal to the longitudinal axis of a feedthrough pin 1201, surrounds the feedthrough pin 1201. The inner surface of each feedthrough insulating structure 1202 may be in close contact with the feedthrough pin that the feedthrough insulating structure surrounds so that there are no substantial gaps between the feedthrough insulating structure 1202 and the feedthrough pin 1201.

Each feedthrough insulating structure 1202 protrudes from a feedthrough base 1203 of the feedthrough. The feedthrough base 1203 may be metallic or ceramic. In particular, the feedthrough base 1203 may be an electrically grounded metal. Each feedthrough insulating structure 1202 may be ceramic and secured to an opening for the feedthrough through the feedthrough base 1203 by, for example, a brazing process. Each feedthrough insulating structure 1202 protrudes further from the feedthrough base 1203 than the feedthrough pin 1201 that the feedthrough insulating structure 1202 surrounds. The end of the feedthrough pin is therefore recessed within the feedthrough insulating structure 1202.

Each channel 1103 of the connector insulating structure 1102 is arranged to receive a corresponding feedthrough insulating structure 1202 of the feedthrough. The outer walls of the feedthrough insulating structure 1202 may be in substantially contact with the inner walls of the channel 1103 so that there are substantially no gaps between the outer walls of the feedthrough insulating structure 1202 and the inner walls of the channel 1103.

The end of each feedthrough insulating structure 1202 that protrudes further from the feedthrough base 1203 than the feedthrough pin 1201 is received in the substantially annular gap between the connector tubular structure 1101 and the channel 1103.

The end of each feedthrough insulating structure 1202 is arranged to receive the plug 406 and at least part of a connector tubular structure 1101 comprised by the connector. The feedthrough pin 1201 is arranged electrically connect with the plug 406. The plug 406 may receive the feedthrough pin 1201 by a press fit.

There may be a tight fit between the connector and the feedthrough so that the gaps in the power interface are minimized, and preferably there are substantially no gaps.

The connector may be secured to the feedthrough by, for example, bolts as described in the previous embodiments. When the connector is secured to the feedthrough, there may be substantially no air within the connection.

In the present embodiment, when the connector and the feedthrough are connected to each other, there is a bi-directional boundary surface that is a creep length distance between each plug 406 and a grounded surface. The grounded surface may be, for example, the surface of the feedthrough base 1203, or another surface of the charged particle apparatus or the housing of the connector. The boundary surface is bi-directional in a direction that is parallel to a power supply wire or feedthrough pin 1201. The boundary surface of the connector comprises a first part 1101*a* that extends from the plug 406 and along an outer surface of a connector tubular structure 1101, that abuts the inner surface of the feedthrough insulating structure 1202. The boundary surface also comprises a second part 1102*b* that is along an inner surface of a channel 1103 of the connector insulating body 1102 and abuts an outer surface of the feedthrough insulating structure 1202. The substantial parts of the boundary surface are therefore parallel the wire 405 and/or the feedthrough pin 1201.

The feedthrough of the present embodiment may have a single feedthrough pin 1201 or a plurality of feedthrough pins 1201. In an implementation of the feedthrough with a plurality of feedthrough pins 1201, between any two of the plugs 406 there is at least a similarly bi-directional boundary surface that is a creep length distance with substantial parts 1101*a*, 1102*b* parallel the wire 405 and/or the feedthrough pin 1201.

The plug 406 is recessed with the connector. The distance along a channel 1103 between a plug 406 and the end surface 1102*a* of the connector insulating structure 1102 may be greater than the flashover distance between the plug 406 and an electrically conductive object at the end surface 1102*a*. This reduces the risk of such a flashover occurring if a high voltage power supply is provided to the connector when the connector is disconnected from the feedthrough. The creep length distance along a surface of the connector insulating structure 1102 may also be longer than the distance over which electrical breakdown may occur to an electrically conductive object at the end surface 1102*a* of the connector insulating structure 1102, i.e. a minimum creep length.

The present embodiment therefore provides similar advantages to the earlier described embodiments. The orientation of the boundary surface allows the creep length requirement for high voltage operation to be met in a way that enables a feedthrough to be accommodated within a smaller area of the outer housing of a charged particle apparatus than with known techniques. The required volume within the charged particle apparatus to accommodate the feedthrough may also be reduced.

In embodiments, the feedthrough pin 408 may be made from, for example, copper, stainless steel or Tungsten.

In embodiments, the wire 405 may be made from, for example, tin plated copper, as is widely commercially available. The wire 405 may be coated with polyethylene.

In embodiments, the plug 406 may be made from, for example, beryllium copper (becu), stainless steel or titanium.

The connector insulating structure may be made from, for example, PTFE, PEEK or silicon rubber.

The feedthrough insulating structure may be made from, for example, $Al_2O_3$ and/or ceramic.

The housing of the connector 401 may be made from metal, such as stainless steel.

The housing of the charged particle apparatus may be made from metal, such as steel.

The potential difference between one or more of the feedthrough pins 408 and a local ground potential may be, for example, between about 20 kV and 50 kV, and preferably between about 25 kV and 35 kV.

The potential difference between any two of the feedthrough pins 408 may be, for example, between about 3 kV and 20 kV, and preferably between about 5 kV and 15 kV.

In embodiments, a gasket may be provided between the connector 401 the feedthrough 411 so that the connection is watertight. The gasket may be, for example, an O-ring on the connector 401 and/or the feedthrough 411.

In embodiments, the minimum distance between each plug 406 and the end surface of the connector 40, may be at least 50 mm.

In embodiments, the diameter of each feedthrough pin 408 may be, for example, between about 3 mm and 5 mm.

In embodiments, the diameter of each wire 405 may be, for example, between about 3 mm and 5 mm.

In embodiments, the end-to-end length of the connector 401 may be, for example, between about 100 mm and 300 mm, and is preferably 150 mm.

As shown in at least FIG. 7B, the feedthrough 411 may be a double sided structure. One side of the feedthrough 411 has the feedthrough insulating structure 409 arranged to be received by the connector insulating structure 402. The feedthrough may have an outermost end 411*a* that may be the outermost end surface 409*a* of the feedthrough insulating structure 409. The other side of the feedthrough 411 is within the charged particle apparatus and is connected to power supply lines. The power supply lines may be connected to one or more components within the charged particle apparatus, such as a source of a flood column. The feedthrough 411 may have an innermost end 411*b* within the charged particle apparatus. The innermost end may be a surface of the feedthrough insulating structure 409. The distance between at the innermost end 411*b*, or the outermost end 411*a*, of the feedthrough insulating structure 409 and the flange 410, that may be in, on, at least connected to, the wall of the charged particle apparatus, may be in the range 40 mm to 60 mm, and preferably 50 mm. The end-to-end length of the feedthrough 411 may therefore be in the range 80 mm to 120 mm, and preferably 100 mm.

In multi-pin implementations according to embodiments, the minimum lateral spacing between adjacent feedthrough pins 408 may be, for example, in the range of about 10 mm to 15 mm, and preferably about 12 mm.

In embodiments, the minimum diameter of the feedthrough 411 may depend on the number of feedthrough pins 408. For five feedthrough pins 408, the minimum diameter of the feedthrough 411 may be in the range of about 40 mm to 50 mm and is preferably about 46 mm.

Embodiments include a number of modifications and variations to the techniques described above.

The charged particle apparatus that the feedthrough is installed in may be any type of vacuum tool and/or vacuum apparatus. For example, the charged particle apparatus may be a SEM, a flood column or a lithographic apparatus.

The charged particle apparatus 401 may specifically be a multi-beam charged particle apparatus. The charged particle apparatus may comprise any of the components of the apparatuses described above with reference to FIGS. 1, 2 and 3.

The multi-beam charged particle apparatus may be a component of an inspection (or metro-inspection) tool or part of an e-beam lithography tool. The multi-beam charged particle apparatus may be used in a number of different applications that include electron microscopy in general, not just SEM, and lithography.

The multi-beam charged particle apparatus may comprise more than one source of charged particles.

Embodiments include the following numbered clauses.

Clause 1: A connector for electrically connecting a feedthrough of a vacuum tool to a high voltage power source, the connector comprising: a connector wire assembly configured to be in electrical connection with a high voltage power source; and a connector insulator comprising a channel configured to extend into the connector insulator and to receive a feedthrough pin so as to electrically connect the connector wire assembly with the feedthrough pin; wherein the connector insulator is configured to engage with the feedthrough so that a boundary surface of the connector insulator extends substantially bi-directionally in the direction of the longitudinal axis of the channel, optionally wherein the wire assembly comprises a plug for receiving the end of the feedthrough pin.

Clause 2: The connector of clause 1, the boundary surface substantially extending into the connector insulator.

Clause 3: The connector according to clauses 1 or 2, wherein the connector wire assembly has an end surface that is recessed within the connector insulator.

Clause 4: The connector according to any of clauses 1 to 3, wherein the plug is recessed into the connector insulating structure further than the boundary surface.

Clause 5: The connector according to any preceding clause, wherein the plug is recessed into the closed end of the channel.

Clause 6: The connector according to any of clauses 1 to 5, wherein the connector comprises two or more connector wire assemblies that are configured to electrically connect to respective feedthrough pins; and either: there is a substantially bi-directional boundary surface between electrically conductive surfaces of two of the feedthrough pins and/or connector wire assemblies; or the boundary surface is a substantially bi-directional between electrically conductive surfaces of two of the feedthrough pins and/or connector wire assemblies.

Clause 7: The connector according to any of clauses 1 to 6, wherein there is either a substantially bi-directional boundary surface, or the boundary surface is substantially bi-directional, that extends from an electrically conductive surface of a feedthrough pin and/or connector wire assembly to an electrically conductive surface of the feedthrough, connector and/or a vacuum tool that comprises the feedthrough.

Clause 8: The connector according to any preceding clause, wherein the connector wire assembly has an end surface that is recessed within the connector insulator.

Clause 9: The connector according to any preceding clause, the connector further comprising a housing configured to provide an outward surface electrically insulated from the power source.

Clause 10: The connector according to any of clauses 1 to 9, the connector further comprising: a housing of the connector that is arranged to provide an outer surface of the connector that is electrically insulated from the power source; wherein: optionally, the connector insulator is within the housing and comprises insulating material; optionally, the connector insulator is configured to engage with at least part of a feedthrough insulator of insulating material of the feedthrough; optionally, the channel extends into the connector insulator from an end surface of the connector insulator and is preferably linear, wherein the end surface of the connector insulator is an end surface of the connector, and the channel has an open end that is at the end surface and a closed end that is recessed within the connector insulator; optionally, the connector wire assembly is within the channel; and optionally, when the connector is connected to the feedthrough, the substantially bi-directional boundary surface extends from an electrically conductive surface of the feedthrough pin and/or connector wire assembly towards the perimeter of the end surface.

Clause 11: The connector according to clause 10 when dependent on clause 6 (i.e. wherein the connector comprises two or more connector wire assemblies that are configured to electrically connect to respective feedthrough pins; and the boundary surface is a substantially bi-directional between electrically conductive surfaces of two of the feedthrough pins and/or connector wire assemblies, and), wherein: the connector comprises two or more linear channels in the connector insulator respective to the two or more connector wire assemblies, each linear channel being arranged to receive a feedthrough pin of the feedthrough; and each connector wire assembly is within one of the plurality of linear channels.

Clause 12: The connector according to clause 10 or 11, wherein the minimum distance between each connector wire assembly and the end surface is greater than the distance at which flashover may occur between the connector wire assembly and an object at the end surface when a high voltage is applied to the connector wire assembly.

Clause 13: The connector according to any of clauses 10 to 12, wherein each connector wire assembly comprises a wire and a plug attached to the end of the wire; and optionally the plug is for receiving the end of the feedthrough pin.

Clause 14: The connector according to any of clauses 10 to 13, wherein each connector wire assembly is at the closed end of a channel.

Clause 15: The connector according to of clauses 10 to 14, wherein: the connector insulator comprises a base and one or more elongate tubular structures; each tubular structure is secured to the base at an opposite end of the channel to the end surface; and each connector wire assembly extends through at least part of the base.

Clause 16: The connector according to clause 15, wherein the surface that provides the substantially bi-directional boundary surface extending from an electrically conductive surface of a feedthrough pin and/or connector wire assembly towards the perimeter of the end surface is at least partially along an outer surface of at least one of the one or more tubular structures.

Clause 17: The connector according to claim 15 or 16, wherein each channel extends into the base Clause 18: The connector according to any of clause 15 to 16, wherein, in a plane orthogonal to the longitudinal axis of each channel, each channel of the connector insulator is the central hole of an annular cross-section of one of the tubular structures.

Clause 19: The connector according to any of clauses 11 to 18, wherein the surface that provides the substantially bi-directional boundary surface extending from an electrically conductive surface of a feedthrough pin and/or connector wire assembly towards the perimeter of the end surface is at least partially along an outer surface of at least one of the one or more tubular structures.

Clause 20: The connector according to any of clauses 10 to 19 wherein each channel extends into the base.

Clause 21: The connector according to any of clauses 10 to 20, wherein potting material is provided between each connector wire assembly and preferably the base so that there are substantially no air gaps between each connector wire assembly and the base.

Clause 22: The connector according to any of clauses 1 to 21, wherein the connector insulator is a solid body.

Clause 23: The connector according to clause 22, wherein: the connector insulator comprises a connector tubular structure within each of the channels, with each connector tubular structure arranged to protrude from the closed end of a corresponding channel such that, in a plane orthogonal to the longitudinal axis of each channel, there is a substantially annular gap between the connector tubular structure and the channel; each connector tubular structure is an insulator and configured to surround at least part of a connector wire assembly; each channel is arranged to receive a corresponding feedthrough tubular structure of the feedthrough; and the feedthrough tubular structure is received within the gap.

Clause 24: The connector according to clause 23, wherein each connector tubular structure is ceramic.

Clause 25: The connector according to any of clauses 1 to 24, wherein the shortest distance along each bi-directional boundary surface is greater than the electrical breakdown distance when the connector is operated at a high voltage.

Clause 26: The connector according to clause 6, or any clause dependent thereon, wherein the minimum distance along a boundary surface that extends between electrically conductive surfaces of any two of the feedthrough pins and/or connector wire assemblies is greater than the electrical breakdown distance when the connector is operated at a high voltage.

Clause 27: The connector according to any of clauses 9 to 26, wherein the housing is metal.

Clause 28: The connector according to any of clauses 1 to 27 wherein the connector insulator comprises PTFE, PEEK and/or silicon rubber.

Clause 29: The connector according to any of clauses 1 to 28, wherein the number of connector wire assemblies is 1 to 10.

Clause 30: The connector according to any of clauses 1 to 29, wherein the potential difference between one or more of the connector wire assemblies and a local ground potential is between about 20 kV and 50 kV.

Clause 31: The connector according to any of clauses 9 to 30, wherein the housing comprises a connector flange for securing the connector to the vacuum tool.

Clause 32: The connector according to clause 31, wherein the connector flange comprises one or more alignment pins for insertion into respective alignment openings of a feedthrough; and/or the connector flange comprises one or more alignment openings for receiving respective alignment pins of a feedthrough.

Clause 33: A feedthrough for providing a high voltage power supply to a device in a vacuum tool, the feedthrough comprising: a feedthrough insulator configured to engage with a connector; and a feedthrough pin that protrudes from a recessed surface of the feedthrough insulator; wherein the feedthrough pin is configured to electrically connect to a connector wire assembly of the connector; and the feedthrough insulator comprises a boundary surface that extends substantially bi-directionally in the direction of the longitudinal axis of the feedthrough pin.

Clause 34: A feedthrough for providing a high voltage power supply to a device in a vacuum tool, the feedthrough comprising: a feedthrough insulator configured to engage with a connector; and a feedthrough pin that protrudes from a recessed surface of the feedthrough insulator so that an end of the feedthrough pin protrudes from the feedthrough insulator; wherein the feedthrough pin is configured to electrically connect to a connector wire assembly of the connector; and the feedthrough insulator comprises a boundary surface that extends substantially bi-directionally in the direction of the longitudinal axis of the feedthrough pin.

Clause 35: The feedthrough according to clause 33 or 34, wherein: optionally, the feedthrough pin is configured to be received by a channel of the connector; optionally, the feedthrough insulator comprises insulating material and is configured to engage with a connector insulator of insulating material of the connector; and optionally, the substantially bi-directional boundary surface extends from an electrically conductive surface of the feedthrough pin and/or connector wire assembly towards the perimeter of the end surface.

Clause 36: The feedthrough according to any of clauses 33 to 35, wherein the feedthrough comprises two or more feedthrough pins; and each feedthrough pin protrudes from the feedthrough insulator from a recessed surface in the feedthrough insulator.

Clause 37: The feedthrough according to any of clauses 33 to 36, wherein the number of feedthrough pins is 1 to 10, preferably 2 or 5.

Clause 38: The feedthrough according to any of clauses 33 to 37, wherein: the feedthrough insulator comprises one or more openings that extend into the feedthrough insulator from an end surface of the feedthrough insulator; and each feedthrough pin is located in one of the openings such that, in a plane that is orthogonal to a longitudinal axis of the feedthrough pin, there is a substantially annular opening between the feedthrough pin and the feedthrough insulator.

Clause 39: The feedthrough according to any of clauses 33 to 38, wherein: the feedthrough insulator has a complementary shape to the connector insulator such that, when the feedthrough insulator is engaged with the connector, there is substantially no gap between each feedthrough pin and the inner walls of a corresponding channel of a tubular structure of the connector insulator; and there is substantially no gap between the outer walls of the tubular structure and a receiving part of the feedthrough insulator.

Clause 40: The feedthrough according to any of clauses 34 to 39, wherein the feedthrough insulator comprises a sleeve that, in a plane orthogonal to the longitudinal axis of a feedthrough pin, surrounds all of the feedthrough pins; and the sleeve extends further from a base of the feedthrough insulator than the other parts of the feedthrough insulator.

Clause 41: The feedthrough according to any of clauses 34 to 40, wherein the feedthrough insulator is a solid body.

Clause 42: The feedthrough according to any of clauses 34 to 40, wherein the feedthrough insulator comprises $Al_2O_3$ and/or ceramic.

Clause 43: The feedthrough according to any of clauses 34 or 40, wherein the feedthrough comprises a corresponding feedthrough insulator for each of the feedthrough pins; each feedthrough insulator protrudes from a feedthrough base of the feedthrough; and each feedthrough insulator is a tubular structure that, in a plane orthogonal to the longitudinal axis of the feedthrough pin, surrounds a feedthrough pin.

Clause 44: The feedthrough according to clause 43, wherein each feedthrough insulator protrudes further from the feedthrough base than the feedthrough pin that the feedthrough insulator surrounds.

Clause 45: The feedthrough according to clause 43 or 44, wherein an end of each feedthrough insulator is arranged to receive a corresponding connector tubular structure comprised by the connector.

Clause 46: The feedthrough according to any of clauses 43 to 45, wherein each feedthrough insulator is ceramic.

Clause 47: The feedthrough according to any of clauses 43 to 46, wherein each feedthrough insulator is brazed to the feedthrough base.

Clause 48: The feedthrough according to any of clauses 33 to 47, wherein, when the feedthrough is connected to the connector, the fit between them substantially excludes air.

Clause 49: The feedthrough according to any of clauses 33 to 48, wherein an end of each feedthrough pin is arranged to press fit into a corresponding plug of a connector wire assembly.

Clause 50: The feedthrough according to any of clauses 33 to 49, wherein a perimeter of an opening in a wall of the vacuum tool through which the feedthrough is located provides a local ground potential.

Clause 51: The feedthrough according to any of clauses 33 to 50, further comprising: a feedthrough flange for securing to a connector flange; wherein the feedthrough flange is comprised by the vacuum tool.

Clause 52: The feedthrough according to clause 51, wherein the feedthrough flange comprises one or more alignment pins for insertion into respective alignment openings of a connector flange; and/or the feedthrough flange comprises one or more alignment openings for receiving respective alignment pins of a connector flange.

Clause 53: The feedthrough according to any of clauses 33 to 52, wherein, when the feedthrough is connected to the connector, there is a substantially bi-directional boundary surface between electrically conductive surfaces of two of the feedthrough pins and/or connector wire assemblies.

Clause 54: The feedthrough according to any of clauses 33 to 53, wherein, when the feedthrough is connected to the connector, there is a substantially bi-directional boundary surface that extends from a conductive surface of a feedthrough pin and/or connector wire assembly to a conductive surface of the feedthrough, connector and/or a vacuum tool that comprises the feedthrough.

Clause 55: A power interface for a vacuum tool comprising one or more high voltage devices, the electrical connection comprising: a connector according to any of clauses 1 to 26; and a feedthrough according to any of clauses 33 to 54; wherein the connector is engaged with the feedthrough.

Clause 56: The power interface according to clause 55, wherein, there are substantially no air gaps within the power interface.

Clause 57: The power interface according to clause 55 or 56, wherein the topography of the connector insulator is shaped to correspond to the feedthrough insulator.

Clause 58: The power interface according to any of clauses 55 to 57, wherein the connector and/or the feedthrough comprise a gasket arranged so that the connection between the feedthrough and the connector is airtight.

Clause 59: A vacuum tool comprising a power interface according to any of clauses 55 to 58.

Clause 60: The vacuum tool according to clause 59, wherein, the vacuum tool is a flood column.

Clause 61: The vacuum tool according to clause 59 or 60, wherein the connector is isolated from vacuum conditions in the vacuum tool so that the vacuum conditions are retained when the connector is detached from the feedthrough.

Clause 62: A multi-pin connector for electrically connecting a feedthrough of a vacuum tool to a high voltage power source, the connector comprising: at least two connector wire assemblies configured to connect to the high voltage power source; a connector insulator comprising a respective channel for each connector wire assembly, wherein each channel is configured to extend into the connector insulator and to receive an end of a feedthrough pin so as to electrically connect a connector wire assembly with the feedthrough pin; and the connector insulator is configured to engage with the feedthrough so that boundary surfaces of the connector insulator extend substantially bi-directionally in direction of the longitudinal axis of one of the channels.

Clause 63: A multi-pin feedthrough for providing a high voltage power supply to a device in a vacuum tool, the feedthrough comprising: a feedthrough insulator configured to engage with a connector; and at least two feedthrough pins that each protrude from respective at least two recessed surfaces in the feedthrough insulator; wherein each feedthrough pin is configured to electrically connect to a connector wire assembly of the connector; and the feedthrough insulator comprises boundary surfaces that extend substantially bi-directionally in the direction of the longitudinal axis of the feedthrough pin.

Clause 64: A high-voltage connector for connecting a feedthrough of a vacuum apparatus to a high voltage power source, the high voltage connector comprising: a connector pin configured to connect electrically with a feedthrough pin of the feedthrough; a connector body of insulating material configured to be insertably engageable with a feedthrough to connect electrically the connector pin and the feedthrough pin; wherein: the connector body provides a bi-directional boundary surface that extends in the direction of the connector pin.

Clause 65: A high-voltage connector for connecting a feedthrough of a vacuum apparatus to a high voltage power source, the high voltage connector comprising: two connector pins configured to be connected to a high voltage power source, the pins configured to connect electrically with corresponding feedthrough pins of the feedthrough; a connector solid body of insulating material, configured to be insertably engageable with a feedthrough to connect electrically between the connector pins and the corresponding feedthrough pins; wherein the connector body between the connector pins provides a boundary surface that extends bi-directionally in the direction of the connector pins.

Clause 66: The high-voltage connector of clauses 64 or 65, wherein each connector pin has an end that is recessed within the connector body.

Clause 67: The high-voltage connector of any of clauses 64 to 66, further comprising a housing configured to provide an outward surface electrically insulated from the power source.

Clause 68: A feedthrough for providing a high voltage to an electrical device within a vacuum apparatus, the feedthrough configured to connect to a high-voltage connector, the feedthrough comprising: a feedthrough pin configured to connect electrically with a connector pin of the feedthrough; a feedthrough body of insulating material configured to be insertably engageable with a connector to connect electrically the connector pin and the feedthrough pin; wherein the feedthrough body provides a bi-directional boundary surface that extends in the direction of the feedthrough pin.

Clause 69: A feedthrough for providing a high voltage to an electrical device within a vacuum apparatus, the feedthrough configured to connect to a high-voltage connector, the feedthrough comprising: two feedthrough pins configured to connect electrically with corresponding connector pins of the connector; a feedthrough body of insulating material configured to be insertably engageable with a connector to connect electrically between the feedthrough pins and the corresponding connector pins; wherein the feedthrough body between the feedthrough pins provides a boundary surface that extends bi-directionally in the direction of the feedthrough pins.

Clause 70: The feedthrough of clause 68 or 69, wherein the pin protrudes from the feedthrough body from a recessed surface.

Clause 71: The feedthrough of any of clauses 68 to 70 further comprising a housing for housing the feedthrough and configured to provide an outward surface electrically insulated from the feedthrough pin.

Clause 72: An electrical connection for a vacuum tool comprising a high voltage device, the electrical connection comprising a connector of any of clauses 64 to 67 and a feedthrough of any of clauses 68 to 71, wherein the feedthrough and connector are engaged so as to be connected.

While the present invention has been described in connection with various embodiments, other embodiments will be apparent to those skilled in the art from consideration of the specification and practice of the technology disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A connector for electrically connecting a feedthrough of a vacuum tool to a high voltage power source, the connector comprising:

a connector wire assembly configured to be in electrical connection with the high voltage power source, the wire assembly comprising a plug which is for receiving a first end of a feedthrough pin of the feedthrough; and a connector insulator comprising a tubular structure having a channel configured to extend into the connector insulator and to receive the feedthrough pin so as to electrically connect the connector wire assembly with the feedthrough pin;

wherein:

the connector insulator is configured to engage with an opening in the feedthrough so that a boundary surface of the connector insulator extends substantially bi-directionally in the direction of the longitudinal axis of the channel, the boundary surface substantially extending into the connector insulator; and the boundary surface defining a creep length distance between electrically conductive surfaces that is greater than a minimum creep length distance required to prevent electrical breakdown and flashover at high voltage operation.

2. The connector according to claim 1, wherein the connector wire assembly has an end surface that is recessed within the connector insulator.

3. The connector according to claim 1, wherein the plug is recessed into the connector insulator further than the boundary surface.

4. The connector according to claim 1, wherein the plug is recessed into a closed end of the channel.

5. The connector according to claim 1, wherein the connector comprises two or more connector wire assemblies that are configured to electrically connect to respective feedthrough pins; and the boundary surface is substantially bi-directional between electrically conductive surfaces of two of the feedthrough pins and/or connector wire assemblies.

6. The connector according to claim 1, wherein the boundary surface is substantially bi-directional and extends from an electrically conductive surface of the feedthrough pin and/or connector wire assembly to an electrically conductive surface of the feedthrough, the connector, and/or a vacuum tool that comprises the feedthrough.

7. The connector according to claim 1, further comprising:

a housing of the connector that is arranged to provide an outer surface of the connector that is electrically insulated from the high voltage power source.

8. The connector according to claim 7, wherein at least one of:

the connector insulator is within the housing and comprises insulating material;

the connector insulator is configured to engage with at least part of a feedthrough insulator of insulating material of the feedthrough;

the channel extends into the connector insulator from an end surface of the connector insulator and is preferably linear, wherein the end surface of the connector insulator is an end surface of the connector, and the channel has an open end that is at the end surface and a closed end that is recessed within the connector insulator;

the connector wire assembly is within the channel; and when the connector is connected to the feedthrough, the substantially bi-directional boundary surface extends from an electrically conductive surface of the feedthrough pin and/or connector wire assembly towards a perimeter of the end surface.

9. The connector according to claim 7, wherein:

the connector comprises two or more connector wire assemblies that are configured to electrically connect to respective feedthrough pins;

the boundary surface is a substantially bi-directional between electrically conductive surfaces of two of the feedthrough pins and/or connector wire assemblies;

the connector comprises two or more linear channels in the connector insulator respective to the two or more connector wire assemblies, each linear channel being arranged to receive a feedthrough pin of the feedthrough; and each connector wire assembly is within one of the plurality of linear channels.

10. The connector according to claim 7, wherein each connector wire assembly comprises a wire and the plug attached to the end of the wire.

11. The connector according to claim 7, wherein:

the connector insulator comprises a base and one or more elongate tubular structures;

each tubular structure is secured to the base at an opposite end of the channel to the end surface; and each connector wire assembly extends through at least part of the base.

12. The connector according to claim 1, wherein the connector insulator is a solid body.

13. The connector according to claim 1, wherein the shortest distance along each bi-directional boundary surface is greater than the electrical breakdown distance when the connector is operated at a high voltage.

14. A feedthrough for providing a high voltage power supply to a device in a vacuum tool, the feedthrough comprising:

a feedthrough insulator configured to engage with a connector; and a feedthrough pin that protrudes from a recessed surface of the feedthrough insulator so that an end of the feedthrough pin protrudes from the feedthrough insulator;

wherein the feedthrough pin is configured to electrically connect to a connector wire assembly of the connector; and the feedthrough insulator comprises a boundary surface that extends substantially bi-directionally in the direction of the longitudinal axis of the feedthrough pin, wherein the boundary surface defines a creep length distance between electrically conductive surfaces that is greater than a minimum creep length distance required to prevent electrical breakdown and flashover at high voltage operation.

15. The feedthrough according to claim 14, wherein the substantially bi-directional boundary surface extends from an electrically conductive surface of the feedthrough pin and/or connector wire assembly towards a perimeter of an end surface of a connector insulator.

16. The feedthrough according to claim 14, wherein:

the feedthrough insulator comprises one or more openings that extend into the feedthrough insulator from an end surface of the feedthrough insulator; and each feedthrough pin is located in one of the openings such that, in a plane that is orthogonal to a longitudinal axis of the feedthrough pin, there is a substantially annular opening between the feedthrough pin and the feedthrough insulator.

17. The feedthrough according to claim 14, wherein:

the feedthrough insulator has a complementary shape to a connector insulator such that, when the feedthrough insulator is engaged with the connector, there is substantially no gap between each feedthrough pin and inner walls of a corresponding channel of a tubular structure of the connector insulator; and there is substantially no gap between outer walls of the tubular structure and an opening of the feedthrough insulator.

18. A high voltage connector for connecting a feedthrough of a vacuum apparatus to a high voltage power source, the high voltage connector comprising:

a connector pin configured to connect electrically with a feedthrough pin of the feedthrough;

a connector body of insulating material configured to be insertably engageable with the feedthrough to connect electrically the connector pin and the feedthrough pin;

wherein the connector body provides a bi-directional boundary surface that extends in the direction of the connector pin, wherein the boundary surface defines a creep length distance between electrically conductive surfaces that is greater than a minimum creep length distance required to prevent electrical breakdown and flashover at high voltage operation.

19. The high voltage connector of claim 18, wherein each connector pin has an end that is recessed within the connector body.

20. A power interface for a vacuum tool comprising one or more high voltage devices, the power interface comprising:

a connector according to claim 1; and the feedthrough providing a high voltage power supply to one of the high voltage devices in the vacuum tool, the feedthrough comprising:

a feedthrough insulator configured to engage with the connector; and the feedthrough pin protrudes from a recessed surface of the feedthrough insulator so that an end of the feedthrough pin protrudes from the feedthrough insulator;

wherein the feedthrough pin is configured to electrically connect to the connector wire assembly of the connector; and the feedthrough insulator comprises a boundary surface that extends substantially bi-directionally in the direction of the longitudinal axis of the feedthrough pin, wherein the connector is engaged with the feedthrough.

* * * * *